(12) United States Patent
Barrenscheen et al.

(10) Patent No.: US 10,972,088 B1
(45) Date of Patent: Apr. 6, 2021

(54) TEMPERATURE DETECTION OF A POWER SWITCH BASED ON PAIRED MEASUREMENTS OF CURRENT AND VOLTAGE

(71) Applicant: Infineon Technologies AG, Neubiberg (DE)

(72) Inventors: Jens Barrenscheen, Munich (DE); Andre Arens, Ruethen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/009,685

(22) Filed: Sep. 1, 2020

(51) Int. Cl.
*G01K 7/16* (2006.01)
*H03K 17/082* (2006.01)
*G01R 27/16* (2006.01)
*H03K 17/08* (2006.01)

(52) U.S. Cl.
CPC ............ *H03K 17/082* (2013.01); *G01K 7/16* (2013.01); *G01R 27/16* (2013.01); *H03K 2017/0806* (2013.01); *H03K 2217/0027* (2013.01)

(58) Field of Classification Search
CPC .. G01K 7/16; G01R 27/16; H03K 2017/0806; H03K 17/082; H03K 2217/0027
USPC ................................ 327/108, 109, 512, 513
See application file for complete search history.

(56) References Cited

U.S. PATENT DOCUMENTS

| 6,060,792 | A | 5/2000 | Pelly |
| 6,144,085 | A | 11/2000 | Barker |
| 7,279,765 | B2 | 10/2007 | Ahn et al. |
| 7,489,855 | B2 | 2/2009 | Kraus |
| 8,155,916 | B2 | 4/2012 | Baginski et al. |
| 9,413,352 | B2 | 8/2016 | Lim |
| 9,672,201 | B1 | 6/2017 | Uszkoreit et al. |
| 9,887,532 | B2 | 2/2018 | Djelassi et al. |
| 10,305,363 | B1 | 5/2019 | Chen et al. |

(Continued)

FOREIGN PATENT DOCUMENTS

| DE | 102004063946 A1 | 3/2006 |
| DE | 102016100498 A1 | 7/2016 |

(Continued)

OTHER PUBLICATIONS

Oppenheim et al., Chapter 6, Section 6.3 Basic Structures for IIR Systems, Discrete-Time Signal Processing, 2nd Edition, 1999, pp. 359-361. (Applicant points out, in accordance with MPEP 609.94(a), that the year of publication, 1999, is sufficiently earlier than the effective U.S. filing date, so that the particular month of publication is not in issue.).

(Continued)

*Primary Examiner* — William Hernandez
(74) *Attorney, Agent, or Firm* — Shumaker & Sieffert, P.A.

(57) ABSTRACT

This disclosure is directed to circuits and techniques for detecting or responding to temperature of a power switch based on paired measurements of current and voltage. A driver circuit for a power switch may be configured to perform a current measurement and a voltage measurement associated with a temperature-dependent circuit element and control the power switch based at least in part on the current measurement and the voltage measurement. In some examples, the current and voltage measurements may be used to determine the temperature of the power switch.

21 Claims, 13 Drawing Sheets

(56) References Cited

U.S. PATENT DOCUMENTS

| | | |
|---|---|---|
| 2002/0024376 A1 | 2/2002 | Sander |
| 2005/0184715 A1 | 8/2005 | Kidokoro et al. |
| 2005/0270869 A1 | 12/2005 | Krischke et al. |
| 2007/0008744 A1 | 1/2007 | Heo et al. |
| 2007/0194009 A1 | 8/2007 | Seger |
| 2012/0194119 A1 | 8/2012 | Kroeze et al. |
| 2013/0301175 A1 | 11/2013 | Posat |
| 2014/0078629 A1 | 3/2014 | Cortigiani et al. |
| 2014/0091384 A1 | 4/2014 | Petruzzi et al. |
| 2015/0226787 A1* | 8/2015 | Mankel .............. G01K 7/01 702/64 |
| 2015/0381152 A1 | 12/2015 | Choi et al. |
| 2017/0063077 A1 | 3/2017 | Donath et al. |
| 2017/0294772 A1 | 10/2017 | Illing et al. |
| 2017/0294918 A1 | 10/2017 | Illing et al. |
| 2017/0294922 A1 | 10/2017 | Illing et al. |
| 2017/0338737 A1 | 11/2017 | Kohama |
| 2017/0358512 A1* | 12/2017 | Kakimoto .............. H01L 23/34 |
| 2017/0366116 A1 | 12/2017 | Ogawa et al. |
| 2018/0102774 A1 | 4/2018 | Leong et al. |
| 2018/0138904 A1* | 5/2018 | Nagase .............. H02M 1/08 |
| 2018/0219543 A1* | 8/2018 | Komo .............. H03K 17/145 |
| 2018/0287365 A1 | 10/2018 | Djelassi-Tscheck et al. |
| 2019/0043969 A1* | 2/2019 | Wood .............. H01L 29/8083 |
| 2019/0131863 A1 | 5/2019 | El Markhi et al. |
| 2019/0204889 A1* | 7/2019 | Kaeriyama .............. G01K 7/01 |
| 2020/0021207 A1 | 1/2020 | Donat et al. |

FOREIGN PATENT DOCUMENTS

| | | |
|---|---|---|
| DE | 102015144460 A1 | 3/2017 |
| DE | 102017107520 A1 | 11/2017 |
| DE | 102017107523 A1 | 11/2017 |
| DE | 102017106896 A1 | 10/2018 |
| GB | 2549934 A | 11/2017 |
| KR | 20150141404 A | 12/2015 |
| KR | 101807300 B1 | 12/2017 |
| WO | 01/69784 A1 | 9/2001 |

OTHER PUBLICATIONS

Infineon Technologies AG, "BTN8962TA High Current PN Half Bridge NovalithIC™," Data Sheet, Rev. 1.0, May 17, 2013, 26 pp.

International Standard ISO 7637-2, Third Edition, Mar. 1, 2011, entitled "Road vehicles-Electrical disturbances from conduction and coupling—Part 2: Electrical transient conduction along supply lines only," 48 pp.

International Standard ISO 26262-1, Second Edition, Dec. 2018, entitled "Road vehicles-Functional safety—Part 1: Vocabulary," 42 pp.

* cited by examiner

TEMPERATURE DETECTION OF A POWER SWITCH BASED ON PAIRED MEASUREMENTS OF CURRENT AND VOLTAGE

TECHNICAL FIELD

This disclosure relates to power switches, and more specifically, techniques and circuits for detecting temperature in power switch circuits.

BACKGROUND

Power switches are used in a wide variety of applications in order to control power being delivered to a load. A power switch may comprise a Field Effect Transistor (FET), a bipolar junction transistor (BJT), a gallium nitride (GaN) switch, or possibly a silicon-controlled rectifier (SCR). Examples of FETs may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same. Examples of BJTs may include, but are not limited to, PNP, NPN, heterojunction, or any other type of BJT, or any combination of the same.

Power switches are typically controlled via a modulation control signal, such as pulse width modulation (PWM), pulse frequency modulation (PFM), pulse duration modulation, pulse density modulation, or another type of modulation control signal. Modulation control signals can be applied to a power switch so as to control on/off switching of the power switch, and thereby control the average amount of power delivered through the power switch to a load. The on/off switching of the power switch effectively chops its power delivery up into discrete parts. The average value of voltage and/or current fed to a load can be controlled by turning the switch on and off at a fast rate. The longer the switch is on compared to the off periods, the higher the total power supplied to the load. In many applications, two different power switches are configured in a high-side and low-side configuration, and the on/off switching of the two power switches is synchronized in order to deliver the desired power to a switch node positioned between the high-side and low-side switch.

The ability to detect temperature in a power switch is highly desirable. To do so, conventional techniques often use external components, such as negative temperature coefficient (NTC) thermistors or semiconductor-based temperature sensors (e.g., diodes) that are mounted close to the power switch. These external components may be galvanically isolated from the power switch in order to simplify measurements. Unfortunately, these conventional techniques can be imprecise and may result in delayed reactions to temperature-related problems with the switch. For example, external components may measure the temperature of the housing of the switch or a temperature close to the switch with a certain intrinsic delay, but these measurements are not always precisely indicative the temperature of the power switch itself.

SUMMARY

In general, this disclosure describes several different techniques for detecting temperature in a power switch circuit and controlling the power switch in response to the detection of temperature. The power switch circuit may comprise a power switch and a temperature-dependent circuit element (such as a temperature-dependent resistor or other circuit element that operates with temperature dependence). The temperature-dependent circuit element may be electrically coupled to at least one node of the power switch. A driver circuit for the power switch may be configured to perform useful techniques that facilitate precise temperature detection. Moreover, a variety of driver control techniques are described for controlling the power switch in response to the temperature detection. The control techniques may include local control techniques that can be implemented in logic of the driver circuit, e.g., to disable the power switch or to adjust transition time of the power switch. Additionally or alternatively, the control techniques may include system-level control techniques that may be implemented by a controller of the driver circuit, e.g., to adjust modulation control signals delivered to the power switch.

In some examples, this disclosure describes techniques that perform paired measurements of both current and voltage to facilitate precise temperature determinations associated with the power switch. In such examples, the current and voltage measurements may be performed based on timing associated with on/off switching of the power switch. For example, the current and voltage measurements may be performed at specific times when a voltage over the power switch is stable and when the power switch is not in a transition state. The measurements may be paired, in that both the current measurement and the voltage measurement are made in temporal proximity with each other, e.g., within a time window where temperature is unlikely to change in the power switch, or where the voltage does not change significantly between two current measurements (or vice versa). In some examples, the current and voltage measurements can be made within a same switching period of the power switch, although paired measurements could also span multiple switching periods in other examples. In other examples, the current and voltage measurements can be made periodically at precise times during different switching periods of the power switch. The voltage and current measurements may facilitate calculation of input impedance of a temperature-dependent circuit element coupled to at least one node of the power switch, and this input impedance of the temperature-dependent circuit element may be indicative of temperature of the power switch. In any case, the driver circuit may be further configured to control the power switch based at least in part on the current measurement and the voltage measurement. Again, several different control techniques are also described.

In other examples, this disclosure describes techniques whereby a driver circuit is configured to modulate its output impedance and perform one or more voltage measurements while modulating the output impedance of the driver circuit. In these examples, the techniques for modulating the output impedance of the driver circuit and performing the one or more voltage measurements may be performed based on timing associated with on/off switching of the power switch, and in some cases, the techniques can be performed periodically during different switching periods of the power switch. For example, modulating the output impedance of the driver circuit and performing the one or more voltage measurements may be performed at specific times when a voltage over the power switch is stable and when the power switch is not in a transition state. By modulating (e.g., adjusting or re-configuring) the output impedance of the driver circuit at a time when the power switch is stable, the driver circuit can be configured to calculate an input impedance of a temperature-dependent circuit element that is coupled to a node of the power switch, based on the one or more voltage measurements and a known ratio when modulating the output impedance of the driver circuit. The input impedance of the temperature-dependent circuit may be indicative of temperature of the power switch. In any case, the driver circuit may be further configured to control the power switch based at least in part on the one or more voltage measurements. Again, several different control techniques are also described.

In one example, this disclosure describes a circuit comprising a driver circuit configured to control a power switch circuit that includes a power switch and a temperature-dependent circuit element electrically coupled to at least one node of the power switch. The driver circuit is configured to deliver a modulation signal to a control node of the power switch to control on/off switching of the power switch. In addition, the driver circuit is configured to perform a current measurement and a voltage measurement associated with the temperature-dependent circuit element and control the power switch based at least in part on the current measurement and the voltage measurement. The current measurement and the voltage measurement are performed based on timing associated with the on/off switching of the power switch.

In another example, this disclosure describes a method of controlling a power switch circuit including a power switch and a temperature-dependent circuit element electrically coupled to at least one node of the power switch. The method comprises delivering a modulation signal to a control node of the power switch to control on/off switching of the power switch, performing a current measurement associated with the temperature-dependent circuit element, performing a voltage measurement associated with the temperature-dependent circuit element, and controlling the power switch based at least in part on the current measurement and the voltage measurement.

In another example, a circuit arrangement comprises a power switch circuit including a power switch and a temperature-dependent circuit element electrically coupled to at least one node of the power switch, and a driver circuit configured to deliver a modulation signal to a control node of the power switch to control on/off switching of the power switch. The driver circuit is configured to perform a current measurement and a voltage measurement associated with the temperature-dependent circuit element and control the power switch based at least in part on the current measurement and the voltage measurement. The current measurement and the voltage measurement are performed based on timing associated with the on/off switching of the power switch.

In another example, this disclosure describes a circuit configured to control a power switch circuit that includes a power switch and a temperature-dependent circuit element electrically coupled to at least one node of the power switch. The circuit comprises a driver circuit configured to be coupled to a supply circuit, wherein the driver circuit is configured to deliver a modulation signal to a control node of the power switch to control on/off switching of the power switch. The driver circuit is further configured to modulate an output impedance of the driver circuit at the control node, perform one or more voltage measurements while modulating the output impedance of the driver circuit, and control the power switch based at least in part on the one or more voltage measurements.

In another example, this disclosure describes a method of controlling a power switch circuit including a power switch and a temperature-dependent circuit element electrically coupled to at least one node of the power switch. The method comprises delivering a modulation signal to a control node of the power switch to control on/off switching of the power switch, modulating an output impedance of the driver circuit at the control node, performing one or more voltage measurements while modulating the output impedance of the driver circuit, and controlling the power switch based at least in part on the one or more voltage measurements.

In another example, a circuit arrangement comprises a power switch circuit including a power switch and a temperature-dependent circuit element electrically coupled to at least one node of the power switch, and a driver circuit configured to be coupled to a supply circuit. The driver circuit is configured to deliver a modulation signal to a control node of the power switch to control on/off switching of the power switch, and the driver circuit is further configured to modulate an output impedance of the driver circuit at the control node, perform one or more voltage measurements while modulating the output impedance of the driver circuit, and control the power switch based at least in part on the one or more voltage measurements.

Details of these and other examples are set forth in the accompanying drawings and the description below. Other features, objects, and advantages will be apparent from the description and drawings, and from the claims.

DETAILED DESCRIPTION

Figure 1:
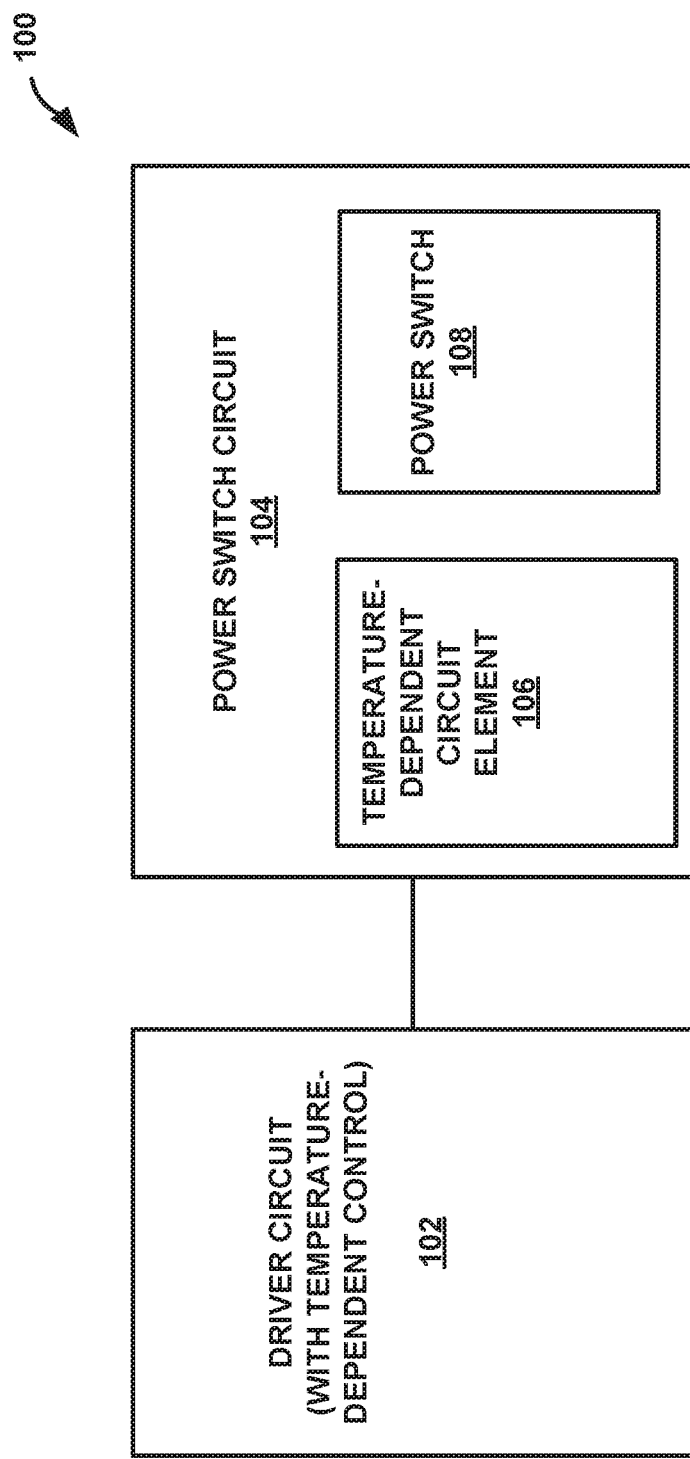
FIG. 1 is a block diagram of an example circuit arrangement that includes a power switch circuit and a driver circuit configured to perform one or more of the techniques described herein.

FIG. 1 is a block diagram of an example circuit arrangement 100 that includes a power switch circuit 104 and a driver circuit 102 with temperature-dependent control. Power switch circuit 104 may comprise a power switch 108 and a temperature-dependent circuit element 106 coupled to at least one node of power switch 108. For example, temperature-dependent circuit element 106 may comprise a temperature-dependent resistor coupled between a control node and an output node of power switch 108. Driver circuit 102 is one example of a driver circuit configured to perform one or more of the techniques described herein. This disclosure describes several different techniques for detecting temperature in a power switch circuit and controlling the power switch in response to the detection of temperature.

In some examples, driver circuit 102 may be configured to perform paired measurements of both current and voltage to facilitate precise temperature determinations associated with temperature-dependent circuit element 106 thereby providing an accurate measure of the temperature of power switch circuit 104. In such examples, driver circuit 102 may be configured to perform the current and voltage measurements based on timing associated with on/off switching of power switch 108. For example, the current and voltage measurements may be performed at specific times when a voltage over power switch 108 is stable and when power switch 108 is not in a transition state. Driver circuit 102 may perform so-called "paired measurements" of current and voltage, in that both the current measurement and the voltage measurement are made in temporal proximity with each other, e.g., within a time window where temperature is unlikely to change in power switch circuit 104, or where the voltage does not change significantly between two current measurements (or vice versa). In some examples, driver circuit 102 may be configured to perform the current and voltage measurements within a same switching period of power switch 108, although paired measurements could also span multiple switching periods in other examples. Moreover, in some cases, the paired measurements can be repeated during successive switching periods of the power switch, e.g., every period or every "Nth" period, where N is a positive integer. In still other cases, the paired measurements can be made in response to a trigger or command from a control circuit. In any case, the voltage and current measurements may facilitate calculation of input impedance of a temperature-dependent circuit element 106, which is coupled to at least one node of power switch 108. This input impedance of the temperature-dependent circuit element 106 may be indicative of temperature of power switch 108. In various examples, driver circuit 102 may be further configured to control power switch 108 based at least in part on the current measurement and the voltage measurement. Again, several different control techniques are also described below.

In other examples, driver circuit 102 may be configured to modulate its output impedance and perform one or more voltage measurements while modulating the output impedance of driver circuit 102. In these examples, modulating the output impedance of the driver circuit 102 and performing the one or more voltage measurements may be performed based on timing associated with on/off switching of power switch 108. For example, modulating the output impedance of driver circuit 102 and performing the one or more voltage measurements may be performed at specific times when a voltage over power switch 108 is stable and when power switch 108 is not in a transition state. Moreover, in some cases, the modulating the output impedance of driver circuit 102 and performing the one or more voltage measurements can be repeated during successive switching periods of the power switch, e.g., every period or every "Nth" period, where N is a positive integer. In still other cases, the modulating the output impedance of driver circuit 102 and performing the one or more voltage measurements can be made in response to a trigger or command from a control circuit. In any case, by modulating (e.g., adjusting or re-configuring) the output impedance of driver circuit 102 at a time when power switch 108 is stable, driver circuit 102 can calculate an input impedance of temperature-dependent circuit element 106 that is coupled to a node of power switch 108 based on the one or more voltage measurements and a known ratio when modulating the output impedance of driver circuit 102. The input impedance of the temperature-dependent circuit 106 may be indicative of temperature, thus providing a measure of the temperature of power switch circuit 104. In any case, driver circuit 102 may be further configured to control power switch 108 based at least in part on the one or more voltage measurements. Again, several different control techniques are also described below.

Figure 2:
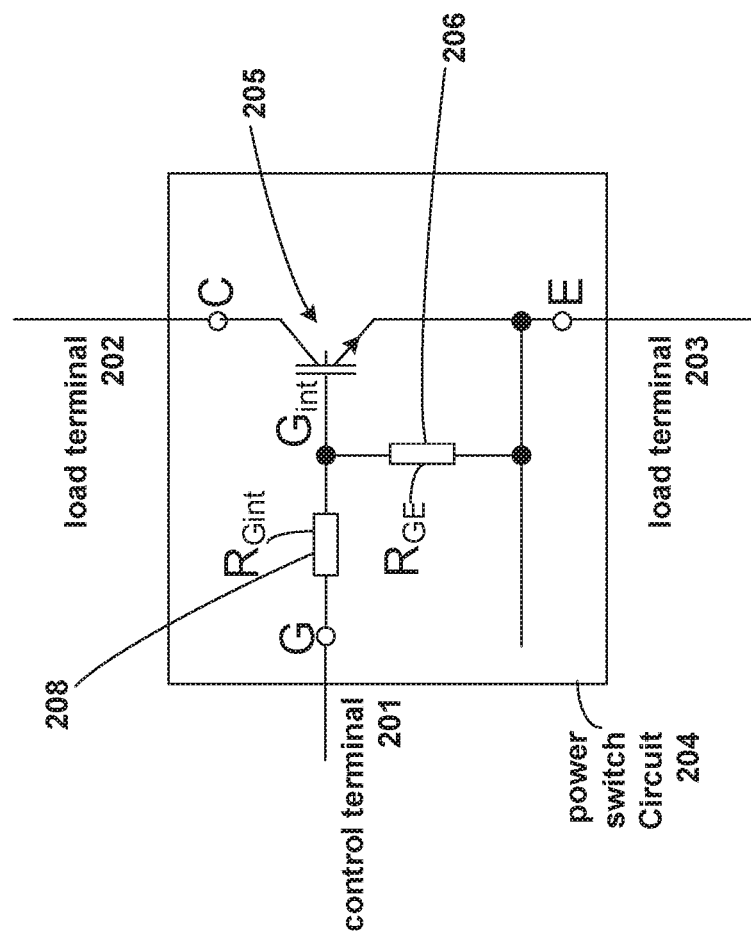
FIG. 2 is an example circuit diagram of a power switch circuit that includes a power switch and a temperature dependent resistor coupled to at least one node of the power switch.

FIG. 2 is an example circuit diagram of a power switch circuit 204 that includes a power switch 205 and a temperature dependent resistor 206 coupled to at least one node of power switch 205. Power switch 205 may comprise any of a wide variety of transistors used for power delivery, such as a Field Effect Transistor (FET), a bipolar junction transistor (BJT), a gallium nitride (GaN) switch, or possibly a silicon controlled rectifier (SCR). Examples of FETs may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same. Examples of BJTs may include, but are not limited to, PNP, NPN, heterojunction, or any other type of BJT, or any combination of the same.

Power control circuit 204 may include a control terminal 201 for providing modulation control signals for on/off switching or power switch 205. Terminals 202 and 203 are labeled as load terminals insofar as a load could be attached to either terminal 202 or terminal 203, depending on the use and configuration of power switch circuit 204 within a larger system. Current flows from terminal 202 to terminal 203 through power switch 205, or from terminal 203 to terminal 202 through power switch 205, depending on the configuration and location of the load. Modulation control signals from a driver circuit can be delivered to control terminal 201 to control on/off switching of power switch 205 so as to deliver current to a load. In the example of a MOSFET, control terminal 201 may comprise a gate, load terminal 202 may comprise a drain, and load terminal 203 may comprise a source. In the example of a BJT, control terminal 201 may comprise a base, load terminal 202 may comprise a collector, and load terminal 203 may comprise an emitter. In some cases, an additional gate resistor 208 (or base resistor for the example of a BGT) may be positioned between the control terminal 201 and the control node of power switch 205. The internal connection between the control terminal and the semiconductor area also forms series resistance.

As shown in FIG. 2, power switch circuit 204 includes a temperature-dependent circuit element (such as a temperature-dependent resistor 206 or other temperature-dependent element) electrically coupled to at least one node of power switch 205. For example, temperature-dependent resistor 206 may be positioned between a control node of power switch 205 and a load node of power switch 205 so as to provide a current path that is positioned in parallel to the current path through power switch 205 from terminal 202 to terminal 203 (or vice versa). According to this disclosure, a driver circuit (not shown in FIG. 2) for power switch 205 may be configured to perform useful techniques that facilitate precise temperature detection of temperature-dependent circuit element 206, which can provide an accurate indication of the temperature of power switch circuit 204. Moreover, a variety of driver control techniques are described for controlling the power switch in response to the temperature detection.

Figure 3:
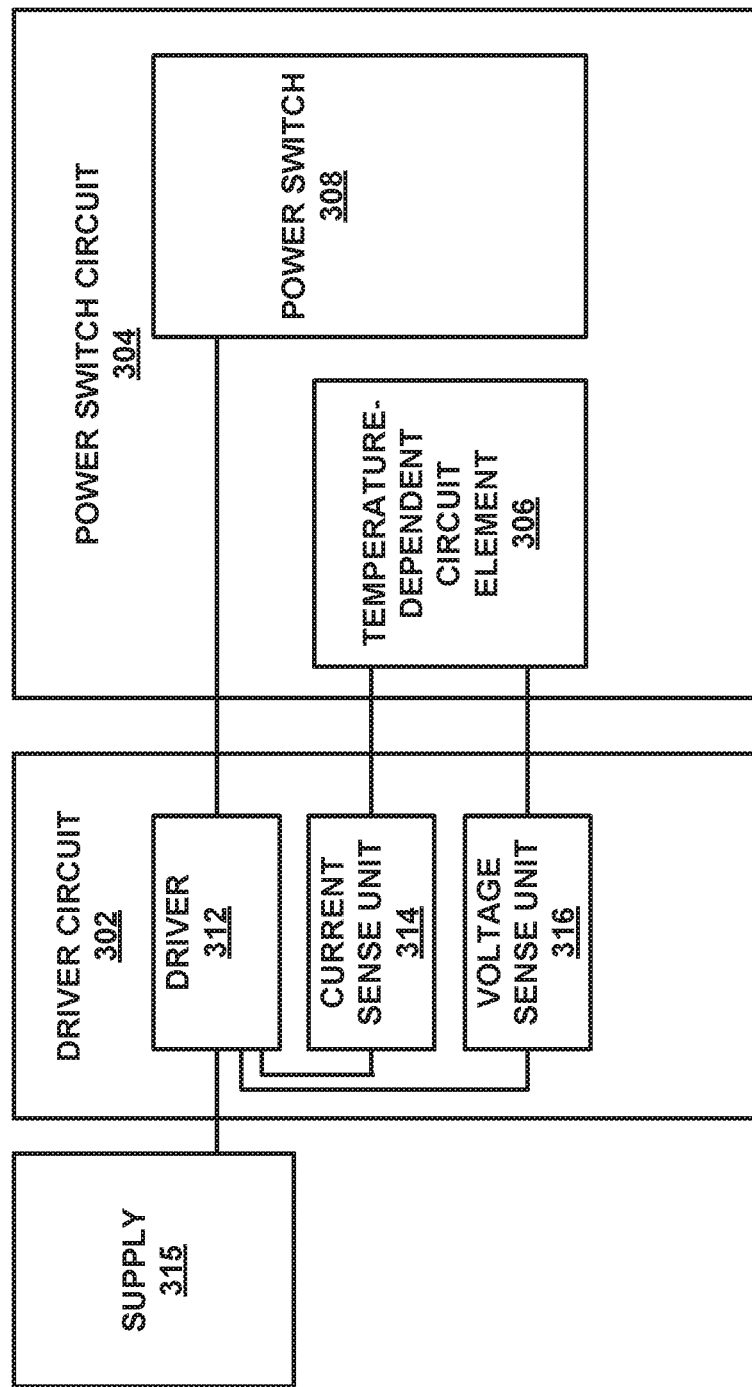
FIG. 3 a block diagram of an example circuit arrangement that includes a power switch circuit and a driver circuit configured to perform one or more of the techniques described herein.

FIG. 3 is a block diagram of an example circuit arrangement 300 that includes a power switch circuit 304 and a driver circuit 302 configured to perform one or more of the techniques described herein. A driver supply 315 may be configured to provide the necessary power to driver circuit 302.

Driver circuit 302 may be configured to control power switch circuit 304. Power switch circuit 304 includes power switch 308 and a temperature-dependent circuit element 306 electrically coupled to at least one node of power switch 302. FIG. 2 shows one example of a power switch circuit 204 that could correspond to power switch circuit 304 of FIG. 3, although other configurations or circuit elements could also be used. In general, driver circuit 302 may include a driver 312 configured to deliver a modulation signal to a control node of power switch 308 to control on/off switching of power switch 308. Furthermore, driver circuit 302 includes a current sense unit 314 configured to perform a current measurement and a voltage sense unit 316 configured to perform a voltage measurement. The current and voltage measurements performed by current sense unit 314 and voltage sense unit 306 may comprise measurements associated with the temperature-dependent circuit element, and the measurements may be paired, in that both the current measurement and the voltage measurement are made in temporal proximity with each other, e.g., within a time window where temperature is unlikely to change in power switch circuit 304, or where the voltage does not change significantly between two current measurements (or vice versa). In some examples, the current and voltage measurements performed by current sense unit 314 and voltage sense unit 306 are made within a same switching period of power switch 308, although paired measurements could also span multiple switching periods in other examples. Accordingly, sometimes measurements can be paired based on extrapolation or known behavior of the circuit, even if the measurements span two or more switching periods. Also, in some cases, paired measurements can be made periodically, e.g., every switching period or every "Nth" switching period, wherein N is a positive integer. Moreover, in some cases, paired measurements can be made in response to a trigger or command to driver circuit 302 from a controller (not shown in FIG. 3). In any case, based on the voltage and current measurements, driver circuit 312 may be configured to calculate an input impedance of temperature-dependent circuit element 306, and this input impedance of the temperature-dependent circuit element 306 may be indicative of temperature of power switch circuit 304. Moreover, driver circuit 312 may be further configured to control power switch 308 based at least in part on the current measurement and the voltage measurement. In some cases, driver circuit 312 may control or adjust operation of power switch based on the calculated impedance, and in some cases, additional steps may be performed by map the calculated impedance to an actual temperature, in which case calculated temperature may be used in the control scheme. Either case can result in desirable control of power switch 308 that is responsive or adaptive to temperature.

In some examples, the current and voltage measurements performed by current sense unit 314 and voltage sense unit 316 are performed based on timing associated with the on/off switching of the power switch, which is controlled by driver 312. For example, the current measurement and the voltage measurement performed by current sense unit 314 and voltage sense unit 316 may be performed at one or more times when a voltage over power switch 308 is stable and power switch 308 is not in a transition state. In some examples, driver 312 may determine that the voltage over power switch 308 is stable based on a determination that driver supply voltage from supply 315 is stable. For example, the current measurement and the voltage measurement may be performed at a time when power switch 308 is turned on, stable, and not in a transition state. Alternatively, the current measurement and the voltage measurement performed by current sense unit 314 and voltage sense unit 316 may be performed at a time when power switch 308 is turned off, stable, and not in a transition state, in which case driver 312 may be configured to apply a negative voltage to the control node of power switch 308 during the current measurement and the voltage measurement. In some examples, current sense unit 314 and voltage sense unit 316 may be configured to refrain from sensing when power switch 308 is unstable or operating in a transition state.

As mentioned, the current and voltage measurements performed by current sense unit 314 and voltage sense unit 316 may comprise paired measurements. In some cases, circuit arrangement 300 may include memory or storage configured to store the paired measurements. In some examples, the voltage measurement may comprise a measurement of voltage supplied to the driver circuit 302, e.g., from supply 315, for driving power switch 308. In other examples, the voltage measurement may comprise a measurement of voltage drop across temperature-dependent circuit element 306. As examples, one or more shunt resistors or current mirror circuits may be used by current sense unit 314 to perform current measurements.

In some examples, voltage sense unit 316 may be used to measure the voltage of the control node of power switch 308 if the temperature-dependent circuit element 306 is connected to the control node. In some examples, voltage sense unit 316 may be used to measure the voltage of supply unit 315 if the voltage drop over unit 312 between the output of the supply unit 315 and the control node of the power switch is known or close to 0. In other examples, voltage sense unit 316 may be used to measure the voltage at a terminal of temperature-dependent circuit element 306 if the other terminal of element 306 is connected to a load terminal of power switch 308.

A variety of driver control techniques can be used for controlling power switch 308 in response to the temperature detection. In some examples, driver circuit 302 includes logic (not shown in FIG. 3) configured to control power switch 308 in response to the current measurement and the voltage measurement indicating a temperature of the power switch. For example, driver 312 may be configured to respond to one or more temperature-related changes in the operation of the power switch circuit. The logic, for example, may be configured to adjust transition speed of power switch 308 in response to the current measurement and the voltage measurement indicating the temperature of power switch 308. As another example, the logic may be configured to disable power switch 308 in response to the current measurement and the voltage measurement indicating the temperature of power switch 308, which may provide device protection. Disabling power switch 308 may include turning off power switch, and in some cases, disabling power switch 308 may also include preventing power switch 308 from being turned on. As noted, in some cases, the circuit response may occur based on a calculation of impedance (e.g., input impedance of temperature-dependent circuit element 306) indicating the temperature of power switch 308. Accordingly, in some examples, logic (not shown in FIG. 3) of driver circuit 302 may be configured to control power switch 308 in response to a calculation of impedance indicating the temperature of the power switch 308, wherein the calculation of the impedance is based on the current measurement and the voltage measurement.

In some examples, current sense unit 314 and voltage sense unit 316 of driver circuit 302 may be configured to perform the current measurement and the voltage measurement within a same switching period of power switch 308. Moreover, in some examples, current sense unit 314 and voltage sense unit 316 of driver circuit 302 may be configured to perform at least one of the current measurement or the voltage measurement a plurality of times within each switching period of the power switch. In still other cases, current sense unit 314 and voltage sense unit 316 of driver circuit 302 may be configured to perform at least one of the current measurement or the voltage measurement a plurality of times during successive switching periods. Also, in some cases, current sense unit 314 and voltage sense unit 316 of driver circuit 302 may be configured to perform at least one of the current measurement or the voltage measurement in response to a command or trigger from a controller (not shown). Driver circuit 302 may be configured to pair and store paired measurements of current and voltage for use in determining temperature. In some examples, current sense unit 314 and voltage sense unit 316 of driver circuit 302 may be configured to perform at least one current measurement and a plurality of voltage measurements within a same switching period of power switch 308.

Power switch 308 may comprise a so-called "high-side" power switch. In some configurations, a high-side power switch is connected to a so-called "low-side" power switch and the load is coupled to a switch node located between the high-side power switch and the low-side power switch. The techniques of this disclosure may be use for temperature detection and control of a high-side power switch, a low-side power switch, or both a high-side power switch and a low-side power switch. In still further examples, a control unit (e.g., a digital control unit) may be used to control driver 312 and possibly deliver commands or triggers to initiate voltage and current measurements for temperature detection. Also, this disclosure describes configurable parameters that may be used to configure driver circuit 302, a control unit, or other units. Additional details of exemplary control units, configurability, and other aspects of temperature detection techniques are described in more detail below.

As mentioned, temperature-dependent circuit element 306 may comprise a temperature-dependent resistor, although other types of temperature-dependent circuit elements could also be used in accordance with this disclosure. In some cases, temperature-dependent circuit element 306 is electrically coupled to a control node of power switch 308 and a load node of power switch 308 (e.g., coupled between the node at Gint and the node at E shown in the example power switch circuit 204 of FIG. 2). In other examples, however, temperature-dependent circuit element 306 may be electrically coupled to a dedicated sensing node (which may include a dedicated sensing pin) associated with power switch circuit 304 and a load node of power switch 308.

Figure 4:
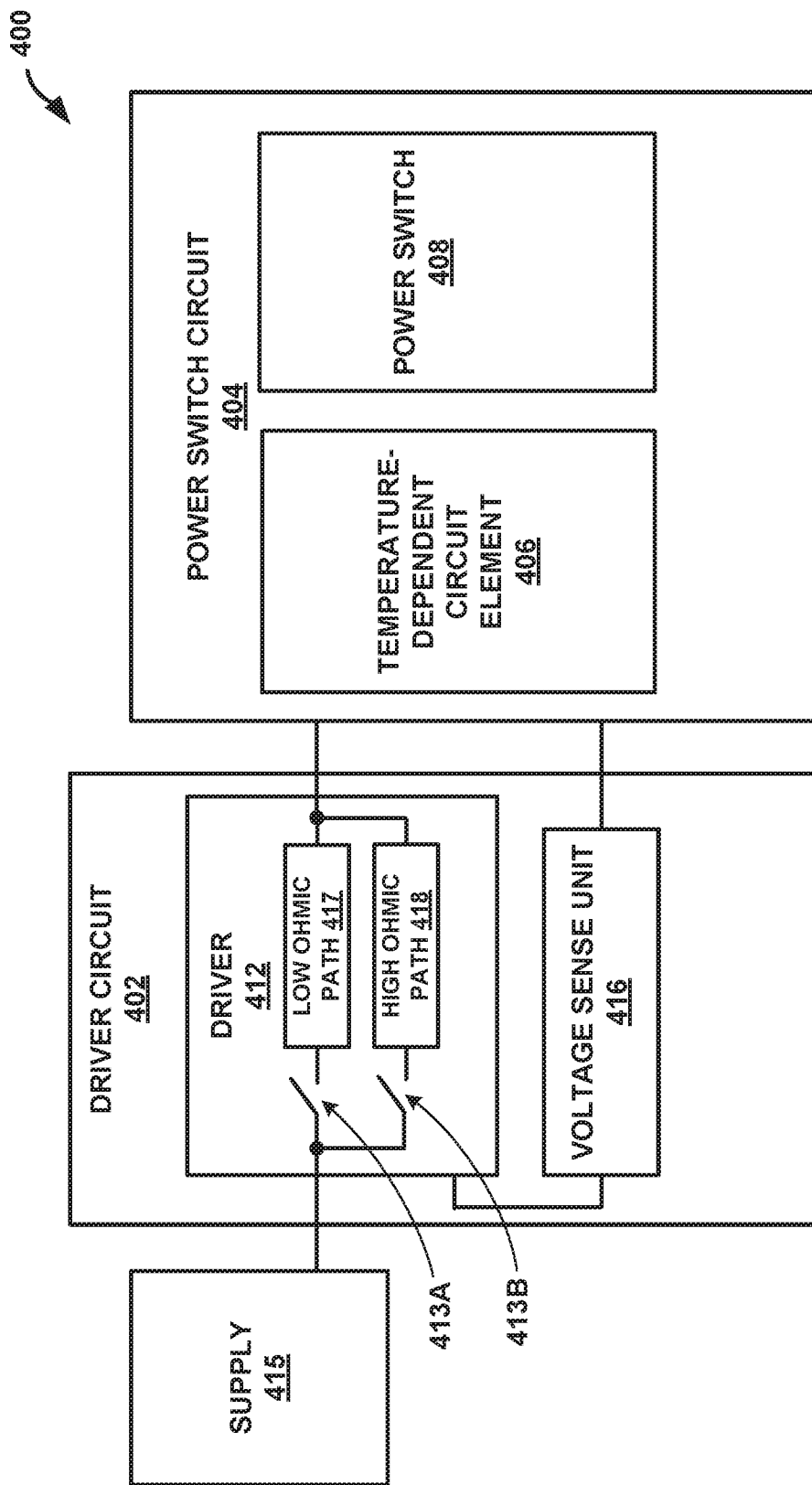
FIG. 4 is a block diagram of an example circuit arrangement that includes a driver circuit with a high ohmic path and a low ohmic path, which may be used to modulate the output impedance of the driver circuit consistent with one or more techniques of this disclosure.

FIG. 4 is a block diagram of an example circuit arrangement 400 that includes a driver circuit 402 comprising a driver 412 that includes both a high ohmic path 418 and a low ohmic path 417. With this example, driver circuit 402 may be used to modulate the output impedance of the driver 412 in order to facilitate accurate temperature measurements based on a known ratio between the voltages associated with high ohmic path 418, e.g., by referring to a reference measurement at a given temperature. As examples, the impedance of the temperature-dependent circuit element 406 may be calculated by measuring the voltages at both terminals of the high-ohmic path if the impedance of the high-ohmic path is known (e.g. by trimming or per construction). In some examples, the temperature of the temperature-dependent circuit element can be calculated based on the ratio between the measured voltages associated with the high-ohmic path 418 and a known ratio at a known temperature.

As examples, the ratio between the voltage at the gate driver terminal connected to the control node of the power switch and the voltage at the gate driver terminal connected to the gate driver supply may be used as a baseline for the temperature calculation. In this case, the path through the gate driver can be configured as ohmic path forming an ohmic divider with the impedance of the temperature-depending circuit element. In one implementation, both voltages may be measured with one or more analog-to-digital converters (ADC) referring to at least one reference voltage and the ratio can be calculated based on the conversion results. In another implementations, the voltage at the supply input terminal of the gate driver may be used as reference for the measurement of the voltage at the gate driver terminal connected to the control node of the power switch. This technique may be called ratiometric measurement and delivers the ratio between both voltages with a single AD conversion. In this case, the result is always "paired", because both voltages are taken into account simultaneously by the ADC. If these measurements are done during a teaching phase, e.g. on a tester device during production test with different temperatures, the conversion results can be directly taken as input for a LUT without the need to know or to trim the value of the high-ohmic path. The low-ohmic path may be used to control the control node of the power switch during transitions between switching states of the power switch and to control the transition itself (e.g. the switching speed). The low-ohmic path may be built in a way that that ensures that a voltage measurement over the low-ohmic path does not deliver measurement results that are precise enough for temperature calculation (e.g. impedance of the low-ohmic path<<impedance of the temperature-dependent circuit element). The driver output impedance may be changed from low-ohmic path to high-ohmic path to allow more precise voltage measurements if the voltages over the load terminals of the power switch are stable and not in a transition, because the voltage drop over the high-ohmic path is bigger than the drop over the low-ohmic path (in steady state).

Driver circuit 402 may be configured to control a power switch circuit 404 that includes a power switch 408 and a temperature-dependent circuit element 406 electrically coupled to at least one node of power switch 408. Driver circuit 402 may be configured to be coupled to a supply circuit 415, and driver circuit 402 may be configured to deliver a modulation signal to a control node of power switch 408 to control on/off switching of power switch 408. Moreover, driver circuit 402 may be further configured to modulate an output impedance of driver circuit 412 at the control node of power switch 402. Voltage sense unit 416 of driver circuit 402 may be configured to perform one or more voltage measurements while driver circuit 412 modulates the output impedance, and driver circuit 402 may control power switch 408 based at least in part on the one or more voltage measurements. In order to modulate the output impedance of driver circuit 402 at the control node of power switch 408, driver 412 may include both a low ohmic path 417 from the supply circuit 415 to the control node of power switch 408, and a high ohmic path 418 from the supply circuit 415 to the control node. One or more switches 413A and 413B may be configured to switch driver 412 between the low ohmic path and the high ohmic path. Accordingly, to modulate its output impedance, driver circuit 412 may be configured to switch driver 412 from the low ohmic path 417 to the high ohmic path 418, and driver circuit 402 may be configured to perform the one or more voltage measurements while driver 412 is configured to define the high ohmic path.

The one or more voltage measurements may be performed at the output of driver circuit 402 and may be used to calculate an input impedance of the temperature-dependent circuit element 406. As examples, both, the low-ohmic path and the high-ohmic path may be built by a path element that can be configured to change its conductivity, such as a transistor. In this case, the description of the high-ohmic path relates to a first operating condition of the configurable path element and the low-ohmic path to a second operating condition of the same path element. In some examples, the low-ohmic path may be operated as a current source and the high-ohmic path may be operated as a resistive element. In some examples, the low-ohmic path elements may be built with components different from the components of the high-ohmic path. The two switches 413A and 413B refer to the activation of the low-ohmic path or of the high-ohmic path. In one implementation, these switches may be used to select the operating conditions leading to a low-ohmic path or a high-ohmic path. In another implementation, these switches may be part of the low-ohmic path and/or of the high-ohmic path.

In some cases, voltage sense unit 416 may perform one or more measurements of voltage at the output of driver 412 and driver circuit 402 may use this voltage measurement and known ratio associated with high ohmic path 418 to determine input impedance of temperature dependent circuit element 406. In this way, driver circuit 402 may be configured to calculate an input impedance of the temperature-dependent circuit element 406 based on the one or more voltage measurements by voltage sense unit 416 and a known ratio when modulating the output impedance of the driver circuit. Low ohmic path 417 may comprise a normal electrical path used when delivering a control signal to power switch 408, whereas high ohmic path 418 may comprise an alternative path with high electrical resistance that is modulated to the control node of power switch 408 when power switch is stable in order to facilitate temperature determinations based on measured voltage and a known ohmic ratio defined by high ohmic path 418. A network of one or more resistors may be used to define high ohmic path 418, although other components could also be used to modulate the output impedance of driver 412. Other components that could be used for such output impedance modulation, for example, may include one or more analog-to-digital converters, one or more switches, or other electrical elements or components.

Driver circuit 412 may be configured to switch from low ohmic path 412 to high ohmic path 418 and cause voltage sense unit 416 to perform the one or more voltage measurements based on timing associated with the on/off switching of the power switch. In some examples, driver circuit 412 is configured to modulate from low ohmic path 417 to high ohmic path 418 and cause voltage sense unit 416 to perform the one or more voltage measurements at a time when power switch 408 is stable and when power switch 408 is not in a transition state. In some examples, driver 412 may determine that the voltage over power switch 408 is stable based on a determination that driver supply voltage from supply 415 is stable. In some cases, the one or more voltage measurements performed by voltage sense unit 416 are performed at a time when power switch 408 is turned on, stable, and not in a transition state. Alternatively, the one or more voltage measurements performed by voltage sense unit 416 may be performed at a time when the power switch is turned off, in which case driver circuit 402 may be configured to apply a negative voltage to the control node of power switch 408 during the one or more voltage measurements. In some examples, voltage sense unit 416 may be configured to refrain from sensing when power switch 408 is unstable or operating in a transition state.

In some cases, driver circuit 402 may be configured to modulate from a first configuration defining low ohmic path 417 to a second configuration defining high ohmic path 418 and then perform the one or more voltage measurements a plurality of times within one switching period of the power switch. In other cases, driver circuit 402 may be configured to modulate from low ohmic path 417 to high ohmic path 418 and perform the one or more voltage measurements a plurality of times over successive switching periods of power switch 408 or periodically every Nth period of power switch 408, where N is a positive integer. Also, in still other cases, driver circuit 402 may be configured to modulate from low ohmic path 417 to high ohmic path 418 and perform the one or more voltage measurements in response to a command or trigger from a control unit (not shown in FIG. 4). In some cases, voltage sense unit 416 may comprise an analog-to-digital converter (ADC) or an analog amplifier or analog comparator.

Like the example of FIG. 3, with the example of FIG. 4, a variety of driver control techniques can be used for controlling power switch 408 in response to the temperature detection. In some examples, driver circuit 402 includes logic (not shown in FIG. 4) configured to control power switch 408 in response the one or more voltage measurements and a known ratio between voltages or a known impedance of the high-ohmic path indicating a temperature of the power switch. For example, driver 412 may be configured to respond to one or more temperature-related changes in the operation of the power switch circuit 404. The logic, for example, may be configured to adjust transition speed of power switch 408 in response to the one or more the voltage measurements (and the known ratio or impedance)

indicating the temperature of power switch 408. As another example, the logic may be configured to disable power switch 408 in response to the one or more voltage measurements (and the known ratio or impedance) indicating the temperature of power switch 408, which may provide device protection. Disabling power switch 408 may include turning off power switch, and in some cases, disabling power switch 408 may also include preventing power switch 408 from being turned on. As noted, in some cases, the circuit response may occur based on a calculation of impedance (e.g., input impedance of temperature-dependent circuit element 406) or the voltages at the terminals of the high-ohmic path indicating the temperature of power switch 408. Accordingly, in some examples, logic (not shown in FIG. 4) of driver circuit 402 may be configured to control power switch 408 in response to a calculation of impedance indicating the temperature of the power switch 408, wherein the calculation of the impedance is based on the voltage measurement and the known ratio associated with high ohmic path 418.

In some examples, voltage sense unit 416 of driver circuit 402 may be configured to perform several voltage measurements within a same switching period of power switch 408. Moreover, in some examples, voltage sense unit 416 of driver circuit 402 may be configured to perform the voltage measurements a plurality of times within each switching period of power switch 408. In still other cases, voltage sense unit 416 of driver circuit 402 may be configured to perform the one or more voltage measurements a plurality of times during successive switching periods (e.g., every period or every Nth period). Also, in some cases, voltage sense unit 416 of driver circuit 402 may be configured to perform the one or more voltage measurements in response to a command or trigger from a control unit (not shown in FIG. 4).

Like the example of FIG. 3, with the example of FIG. 4, power switch 408 may comprise a so-called "high-side" power switch. In some configurations, a high-side power switch is connected to a so-called "low-side" power switch and the load is coupled to a switch node located between the high-side power switch and the low-side power switch. The techniques of this disclosure may be use for temperature detection and control of a high-side power switch, a low-side power switch, or both a high-side power switch and a low-side power switch. In still further examples, a control unit (e.g., a digital control unit) may be used to control driver 412 and possibly deliver commands or triggers to initiate output impedance modulation and voltage measurements for temperature detection. Also, this disclosure describes configurable parameters that may be used to configure driver circuit 402, a control unit, or other units. Additional details of exemplary control units, configurability, and other aspects of temperature detection techniques are described in more detail below.

Temperature-dependent circuit element 406 may comprise a temperature-dependent resistor, although other types of temperature-dependent circuit elements could also be used in accordance with this disclosure. In some cases, temperature-dependent circuit element 406 is electrically coupled to a control node of power switch 408 and a load node of power switch 408 (e.g., coupled between the node at Gint and the node at E shown in the example power switch circuit 204 of FIG. 2). In other examples, however, temperature-dependent circuit element 406 may be electrically coupled to a dedicated sensing node associated with power switch circuit 404 and a load node of power switch 408.

Figure 5:
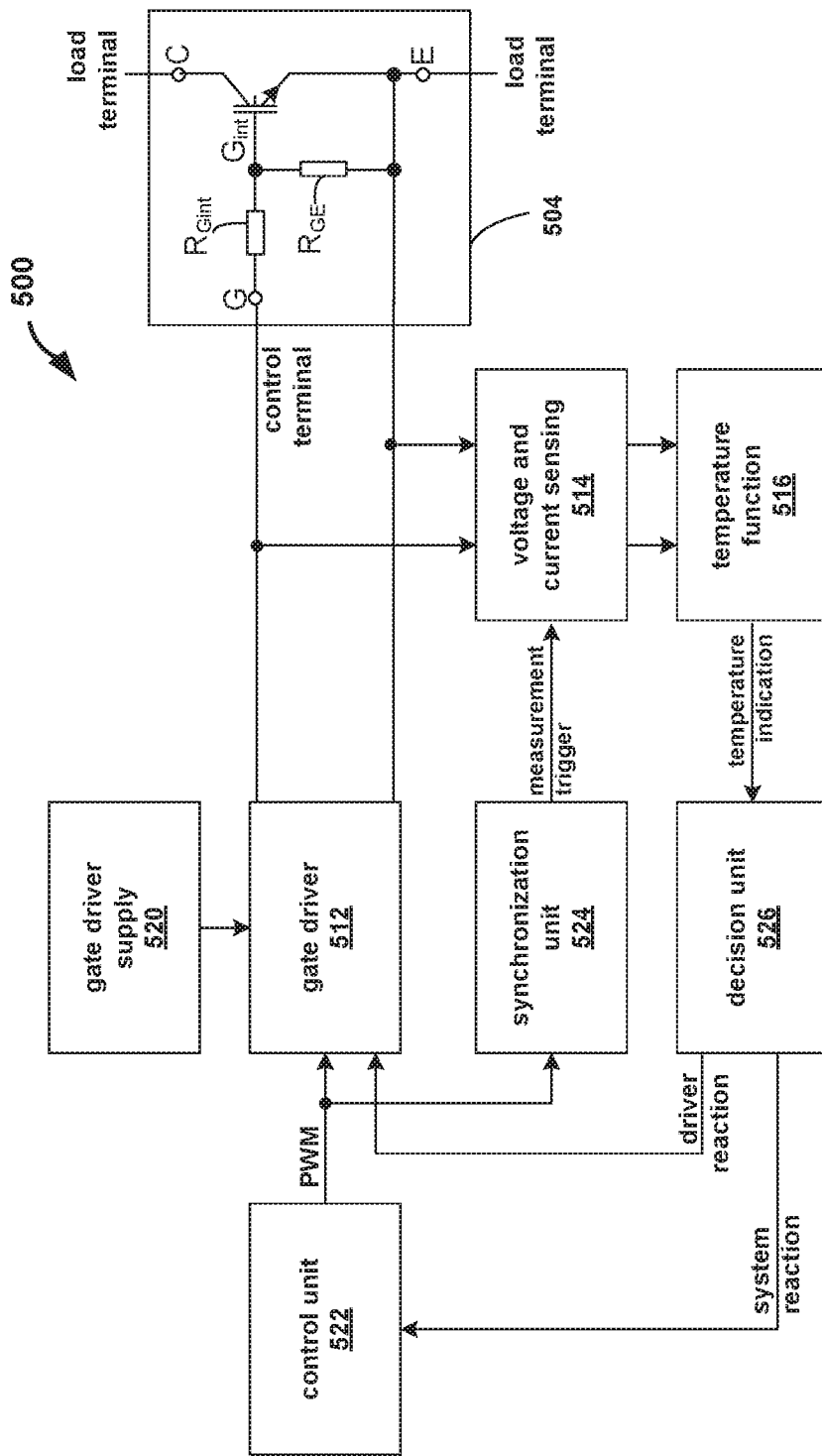
FIG. 5 is another block diagram of an example circuit arrangement capable of performing paired voltage and current measurements.

FIG. 5 is another block diagram of an example circuit arrangement capable of performing paired voltage and current measurements. Circuit arrangement 500 comprises a power switch circuit 504, which may be similar to circuit power switch circuit 204 shown in FIG. 2. Circuit arrangement 500 also includes a control unit 522, which may comprise a digital processing unit, such as a microprocessor, ASIC, FPGA, CPLD, or microcontroller. In addition, circuit arrangement 500 includes a gate driver 512, a gate driver supply 520, a synchronization unit 524, a decision unit 526, a temperature function unit 516 and a voltage and current sensing unit 514. In some examples, units 512, 520, 524, 526, 516 and 514 may be part of a gate driver circuit, although one or more of these units could also be implemented as separate circuits or as part of control unit 522.

Gate driver 512 may be configured to control a power switch within power switch circuit 504, which also includes a temperature-dependent circuit element electrically coupled to at least one node of the power switch. Again, FIG. 2 provides additional details on a power switch circuit 204 that may be similar to power switch circuit 504. Gate driver 512 is configured to deliver a modulation signal to a control node of the power switch within power switch circuit 504 in order to control on/off switching of the power switch. Gate driver supply 520 can provide the necessary power for operation of gate driver 512 and to control the control node of the power switch. Voltage and current sensing unit 514 is configured to perform a current measurement and a voltage measurement associated with the temperature-dependent circuit element within power switch circuit 504. As described herein, these measurements of voltage and current may be paired and timed according to the switching period associated with on/off switching of the power switch within power switch circuit 504.

In some example, the current and voltage measurements performed by voltage and current sensing unit 514 are made within a same switching period of the power switch within power switch circuit 504, although paired measurements could also span multiple switching periods in other examples. Also, in some cases, paired measurements can be made periodically by voltage and current sensing unit 514, e.g., every switching period or every "Nth" switching period, wherein N is a positive integer. Moreover, in some cases, paired measurements can be made in response to a trigger or command to from control unit 522. In some examples, a filter structure may be used to filter results of several paired measurements to reduce noise effects or distortion of a single measurement.

Synchronization unit 524 may deliver measurement trigger signals to voltage and sensing unit 514 to coordinate timing of the paired measurements such that the current measurement and the voltage measurement are performed based on timing associated with the on/off switching of the power switch. Synchronization unit 524 may receive signals (or mirrors of signals) associated with PWM control signals from control unit 522, which are also delivered to gate driver 512. In this way, synchronization unit 524 may identify the times when the voltages over the terminals of the power switch within power switch circuit 504 are stable, triggering paired measurements by voltage and sensing unit 514. Temperature function unit 516 may determine the temperature associated with power switch circuit 504 based on the paired measurements of current and voltage, essentially applying Ohm's Law to calculate for impedance of the temperature-dependent circuit element based on measured voltage and current over and through the temperature-dependent circuit element. In some cases, the calculated impedance itself may be used as an indicator of temperature, and in other cases, the calculated impedance can be mapped to temperature, such as via a mathematical equation or a lookup table (LUT). In any case, temperature function unit 516 may provide a temperature indication to decision unit 526.

Decision unit 526 may be configured to cause driver-level or system-level reactions to temperature, or both driver-level and system-level reactions. Driver-level reactions may include immediate driver response to temperature, e.g., via logic within gate driver 512. Such driver-level reactions may include disabling the power switch within power switch circuit 504 in response to temperature, or possibly adjusting (increasing or reducing) transition times associated with the power switch in response to measured temperature, or changing the timing and/or levels of currents or voltages to charge or discharge the control node of the power switch. In some cases, disabling the power switch may include turning off the power switch, and in some cases, disabling the power switch may include disabling the ability to turn the power switch back on.

As mentioned, decision unit 526 may also be configured to cause system-level reactions to temperature. System level reactions may include adjustment of PWM control signals, e.g., adjusting the duty cycle, based on measured temperature. Driver-level reactions may be more responsive to temperature changes so as to provide circuit protection based on temperature or adjustment of operating conditions of the power switch. System level reactions be help improve operation of the system at different temperatures.

The current and voltage measurements performed by voltage and current sensing unit 514 may be based on timing associated with on/off switching of the power switch within power switch circuit 504, which are controlled by PWM signals defined by control unit 522 and delivered to power switch circuit 504 by gate driver 512. As described herein, the current and voltage measurements may be performed at specific times when a voltage over the power switch within power switch circuit 504 is stable and when the power switch is not in a transition state. Moreover, voltage and current sensing unit 514 may refrain from sensing at other times when the power switch within power switch circuit 504 is either unstable or operating in a transition state. Again, the voltage and current measurements may be so-called "paired measurements" of current and voltage, in that both the current measurement and the voltage measurement are made in temporal proximity with each other, e.g., within a time window where temperature is unlikely to change in power switch circuit 504, or where the voltage does not change significantly between two current measurements (or vice versa). In some examples, voltage and current sensing unit 514 may be configured to perform the current and voltage measurements within a same switching period of the power switch within power switch circuit 504, although paired measurements could also span multiple switching periods in other examples. Moreover, in some cases, the paired measurements can be repeated during successive switching periods of the power switch, e.g., every period or every "Nth" period, where N is a positive integer. In still other cases, the paired measurements can be made in response to a trigger or command from control unit 522. In some cases, a user may be able to cause control unit 522 to initiate the trigger, so as to provide the ability for users to measure temperature of power switch circuit 504, when desired.

Figure 6:
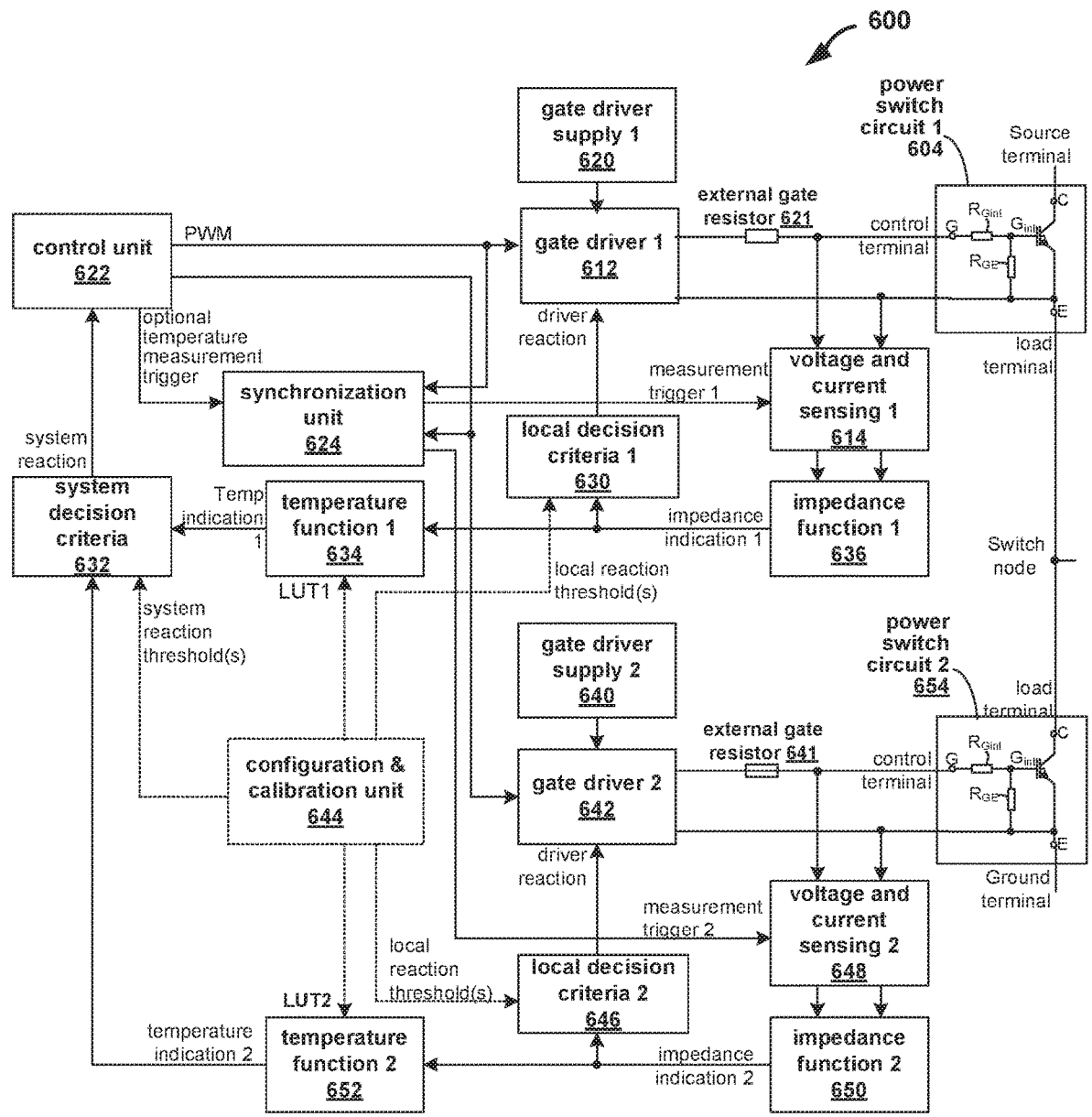
FIG. 6 is another block diagram of a circuit arrangement consistent with the techniques of this disclosure and including both a low-side power switch and low-side driver circuit, and a high-side power switch and high-side driver circuit.

FIG. 6 is another block diagram consistent with the techniques of this disclosure and including both a low-side power switch circuit and low-side gate driver circuit, and a high-side power switch and high-side driver circuit. The example of FIG. 6 includes a first power switch circuit 604 and a second power switch circuit 654, which may be referred to as high-side and low-side power switch circuits. A switch node located between first power switch circuit 604 second power switch circuit 654 delivers power to a load based on on/off switching of the power switches within circuits 604 and 654.

A first gate driver 612 delivers modulation control signals to the high-side power switch within power switch circuit 604, whereas a second gate driver 642 delivers modulation control signals to the low-side power switch within power switch circuit 654. Control unit 622 may deliver PWM commands to gate drivers 612 and 642 to coordinate the on/off switching of the high-side and low-side power switches. External gate resistors 621 and 641 may be included between the control terminals of the power switch circuits 604 and 654 and gate drivers 612 and 642, respectively. These external gate resistors 621 and 641, for example, may define resistances less than 10 Ohms. Gate driver supplies 620 and 640 may provide the power needed to operate gate drivers 612 and 642.

On the high-side, gate driver 612 may be configured to control a power switch within power switch circuit 604. In particular, gate driver 612 is configured to deliver a modulation signal to a control node of the power switch within power switch circuit 604 in order to control on/off switching of the power switch. Voltage and current sensing unit 614 is configured to perform a current measurement and a voltage measurement associated with the temperature-dependent circuit element within power switch circuit 604. As described herein, these measurements of voltage and current may be paired and timed according to the switching period associated with on/off switching of the power switch within power switch circuit 604. Moreover, the timing of the measurements of voltage and current on the high-side, via voltage and current sensing unit 614 may be coordinated relative to the timing of measurements of voltage and current on the low-side, via voltage and current sensing unit 648.

On the low-side, gate driver 642 may be configured to control a power switch within power switch circuit 654. In particular, gate driver 642 is configured to deliver a modulation signal to a control node of the power switch within power switch circuit 654 in order to control on/off switching of the power switch. Voltage and current sensing unit 648 is configured to perform a current measurement and a voltage measurement associated with the temperature-dependent circuit element within power switch circuit 654. As described herein, these measurements of voltage and current may be paired and timed according to the switching period associated with on/off switching of the power switch within power switch circuit 654. Moreover, the timing of the measurements of voltage and current on the low-side, via voltage and current sensing unit 648 may be coordinated relative to the timing of measurements of voltage and current on the high-side, via voltage and current sensing unit 614.

Again, according to this disclosure, the current and voltage measurements performed by voltage and current sensing unit 614 on the high-side may comprise paired measurements. Similarly, the current and voltage measurements performed by voltage and current sensing unit 648 on the low-side may comprise paired measurements. Also, in some cases, paired measurements can be made periodically by voltage and current sensing units 614 and 648, e.g., every other switching period or periodically. In some cases, voltage and current sensing units 614 and 648 may perform sensing in a complimentary fashion, e.g., with voltage and current sensing unit 614 operating in one switching period, and voltage and current sensing unit 648 operating in another (different) switching period or with voltage and current sensing unit 614 operating in portion or phase of a switching period, and voltage and current sensing unit 648 operating in another (different) portion or phase of the switching period.

Synchronization unit 624 can deliver measurement trigger signals to voltage and current sensing units 614 and 648 to coordinate timing of the paired measurements on the high-side and on the low-side. For both the high-side and the low-side, the current measurement and the voltage measurement may be performed based on timing associated with the on/off switching of the power switches. Synchronization unit 624 may receive signals (or mirrors of signals) associated with PWM control signals from control unit 622, which are also delivered to gate drivers 612 and 642 in a complementary fashion. In this way, synchronization unit 624 may identify the times when the power switches within power switch circuits 604 or 654 are stable, triggering paired measurements by voltage and sensing unit 614 and by voltage and sensing unit 648.

On the high-side, impedance function unit 636 may determine the impedance of a first temperature-dependent circuit element with power switch circuit 604 based on paired measurements of current and voltage, essentially applying Ohm's Law to calculate for impedance of the temperature-dependent circuit element based on measured voltage and current over and through the temperature-dependent circuit element. Similarly, on the low-side, impedance function unit 650 may determine the impedance of a second temperature-dependent circuit element with power switch circuit 654 based on paired measurements of current and voltage.

The calculated impedance by impedance function units 636 and 648 may be used as an indicator of temperature. Accordingly, impedance function units 636 and 648 may provide signals indicative of impedance calculations to local decision units 630 and 646, respectively. Local decision units 630 may control logic within gate driver 612 on the high-side to provide immediate driver reactions to temperature. In some cases, logic within gate driver 612 may react to temperature-related changes in circuit operation (e.g., due to high temperature) on the high-side by causing gate driver 612 to disable power the power switch within power switch circuit 604 or to adjust transition time of the power switch within power switch circuit 604. Similarly, logic within gate driver 642 may react to temperature-related changes in circuit operation (e.g., due to high temperature) on the low-side by causing gate driver 642 to disable power the power switch within power switch circuit 654 or to adjust transition time of the power switch within power switch circuit 654.

In addition, impedance function units 636 and 648 may provide signals indicative of impedance calculations to temperature function units 634 and 652, respectively. Temperature function units 634 and 652 may apply a mathematical function or lookup tables (LUTs) in order to calculate temperatures based on the measured impedances. The contents of the LUTs may be filled with calculated values or may be filled with values elaborated during reference measurements with known temperatures. Temperature indications can be delivered from temperature function units 634 and 652 (associated with high-side and low-side switches respectively) to system decision criteria unit 632. System decision criteria unit 632 can then provide signals for system-level reactions to control unit 622 so that control unit can adjust or modify system operation based on the calculated temperatures associated with the high-side and low-side switches, respectively. For example, control unit 622 may adjust PWM signals for first gate driver 612, second gate driver 642, or both gate drivers 612, 642 based on the calculated temperatures. It may also be possible to eliminate temperature function units 634 and 652, in some examples, in which case control unit 622 may be configured to adjust the modulation signals based on the determined impedances determined by impedance function units 636 and 650. From a digital standpoint, however, it is often desirable to program control unit 822 in the temperature domain (rather than impedance domain) even though the calculated input impedance of the temperature-dependent circuit elements may be mathematically related to temperature.

In some examples, various units within circuit arrangement 600 may be configurable, e.g., to configure one or more configurable parameters that define circuit operational responses to temperature. A configuration unit 644 (which may be an external programming unit), for example, may be capable of configuring local reaction thresholds defined by local decision criteria units 630 and 646. Alternatively or additionally, configuration unit 644 may be capable of configuring temperature functions within temperature function units 634 and 652, such as by defining or configuring lookup tables based on testing. Also, in some examples, configuration unit 644 may be capable of defining one or more system reaction thresholds for system decision criteria unit 632, such as for example, by defining temperature thresholds where PWM signals should be adjusted. The various configurable parameters, for example, could be derived from tests (e.g. during one or more production tests) and possibly stored in memory associated with the units or controller, such as one-time programmable (OTP) memory, Flash memory, electrically-erasable programmable read only memory (EEPROM) or any type of volatile or non-volatile memory.

Figure 7:
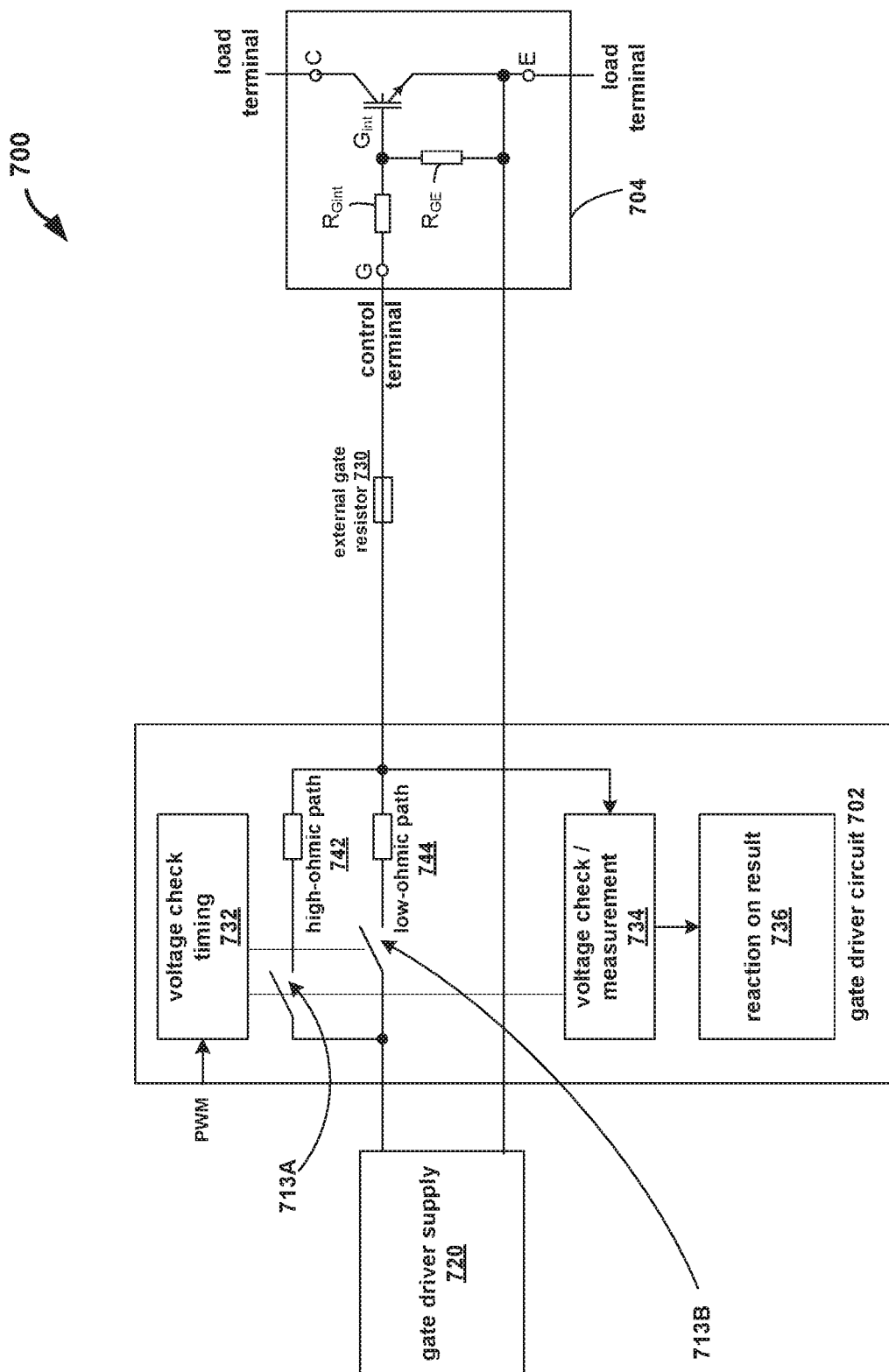
FIG. 7 is a block diagram of an example circuit arrangement that includes a driver circuit capable of modulating its output impedance.

FIG. 7 is a block diagram of an example circuit arrangement 700 that includes a gate driver circuit 702 that includes both a high ohmic path 742 and a low ohmic path 744. With this example, gate driver circuit 702 may be used to modulate its output impedance in order to facilitate accurate temperature measurements based on a known ratio of voltages associated with high ohmic path 742.

Gate driver circuit 702 may be configured to control a power switch circuit 704 that includes a power switch and a temperature-dependent circuit element electrically coupled to at least one node of power switch. FIG. 2 provides additional details on a power switch circuit 204 that may be similar to power switch circuit 704.

Gate driver circuit 702 may be configured to be coupled to a gate driver supply circuit 720, and gate driver circuit 702 may be configured to deliver a modulation signal to a control node of the power switch within power switch circuit 704 to control on/off switching of the power switch. Moreover, gate driver circuit 702 may be further configured to modulate its output impedance at the control node of the power switch within power switch circuit 704. In some examples, an external gate resistor 730 may be positioned between gate driver circuit 702 and power switch circuit 704. For example, external gate resistor 730 may define an impedance of less than 10 Ohms.

Voltage check/measurement unit 734 of gate driver circuit 702 may be configured to perform one or more voltage measurements while gate driver circuit 702 modulates the output impedance, and gate driver circuit 702 may control the power switch within power switch circuit 704 based at least in part on the one or more voltage measurements. Voltage check timing unit 732 may be configured to coordinate the output impedance modulation and voltage sensing by controlling switches 713A and 713B and providing signals to voltage check/measurement unit 734. In order to modulate the output impedance of gate driver circuit 702 at the control node of the power switch within power switch circuit 704, gate driver circuit 702 may include both a low ohmic path 744 from gate driver supply 720 to the control node of the power switch within power switch circuit 704, and a high ohmic path 744 from gate driver supply 720 to the control node. One or more switches 713A and 713B may be configured to switch gate driver circuit 702 between the low ohmic path and the high ohmic path. For example, voltage check timing unit 732 may control switches 713A and 713B based on PWM signals to ensure that modulation of the output impedance of gate driver circuit 702 (and the voltage sensing during such modulation) occurs at proper times within PWM periods where the power switch is stable. To modulate its output impedance, voltage check timing unit 732 of gate driver circuit 702 may be configured to switch gate driver circuit 702 from the low ohmic path 744 to the high ohmic path 742, and voltage check measurement unit 734 may be configured to perform the one or more voltage measurements while gate driver circuit 702 is configured to define the high ohmic path. The one or more voltage measurements may be performed at the output of gate driver circuit 702 and may be used to calculate an input impedance of the temperature-dependent circuit element within power switch circuit 704.

In some cases, voltage check measurement unit 734 may perform one or more measurements of voltages related to gate driver circuit 702 and use this voltage measurements and ratio associated with high ohmic path 742 to determine input impedance of the temperature dependent circuit element within power switch circuit 704. In this way, gate driver circuit 702 may be configured to calculate an input impedance of the temperature-dependent circuit element within power switch circuit 704 based on the one or more voltage measurements by voltage check measurement unit 734 and a voltage ratio when modulating the output impedance of gate driver circuit 702. Low ohmic path 744 may comprise a normal electrical path used when delivering a control signal to power switch circuit 704, whereas high ohmic path 742 may comprise an alternative path with high electrical resistance that is modulated to the control node of power switch circuit 704 when the power switch is stable in order to facilitate temperature determinations based on measured voltage and a known ohmic ratio defined by high ohmic path 742. A network of one or more resistors may be used to define high ohmic path 742, although other components could also be used to modulate the output impedance of gate driver circuit 702. Other components that could be used for such output impedance modulation, for example, may include one or more analog-to-digital converters, one or more switches, or other electrical elements or components.

Voltage check timing unit 732 may be configured to switch from low ohmic path 744 to high ohmic path 742 and cause voltage check measurement unit 734 to perform the one or more voltage measurements based on timing associated with the on/off switching of the power switch. In some examples, voltage check timing unit 732 is configured to modulate gate driver circuit 702 from low ohmic path 744 to high ohmic path 742 and cause voltage check measurement unit 734 to perform the one or more voltage measurements at a time when the power switch within power switch circuit 704 is stable and when the power switch is not in a transition state. In some examples, gate driver may determine that the driver supply voltage from gate driver supply 720 is stable. In some examples, voltage check measurement unit 734 may coordinate impedance modulation and voltage sensing based on PWM signals. In some cases, the one or more voltage measurements performed by voltage check measurement unit 734 are performed at a time when the power switch within power switch circuit 704 is turned on, stable, and not in a transition state. Alternatively, the one or more voltage measurements performed by voltage check measurement unit 734 may be performed at a time when the power switch is turned off, in which case gate driver circuit 702 may be configured to apply a negative voltage to the control node of power switch circuit 704 during the one or more voltage measurements. In some examples, voltage check measurement unit 734 may be configured to refrain from sensing when the power switch within power switch circuit 704 is unstable or operating in a transition state.

In some cases, gate driver circuit 702 may be configured to modulate from a state defining low ohmic path 744 to a state defining high ohmic path 742 and perform the one or more voltage measurements a plurality of times within one switching period of the power switch. In other cases, gate driver circuit 702 may be configured to modulate from a state defining low ohmic path 744 to a state defining high ohmic path 742 and perform the one or more voltage measurements a plurality of times over successive switching periods of the power switch within power switch circuit 704 or periodically every Nth period of the power switch, where N is a positive integer. Also, in still other cases, gate driver circuit 702 may be configured to modulate from a state defining low ohmic path 744 to a state defining high ohmic path 742 and perform the one or more voltage measurements in response to a command or trigger from a control unit (not shown in FIG. 7). In some cases, voltage check measurement unit 734 may comprise an analog-to-digital converter (ADC) or an analog amplifier or analog comparator.

Reaction on result unit 736 may generally represent any of variety of driver control techniques can be used for controlling the power switch within power switch circuit 704 in response to the temperature detection. In some examples, reaction on result unit 736 includes logic configured to control the power switch within power switch circuit 704 in response the one or more voltage measurements and a known ratio indicating a temperature of the power switch. For example, unit 736 may be configured to respond to one or more temperature-related changes in the operation of power switch circuit 704. The logic, for example, may be configured to adjust transition speed of the power switch within power switch circuit 704 in response to the one or more the voltage measurements (and the known ratio) indicating the temperature of the power switch. As another example, the logic may be configured to disable the power switch within power switch circuit 704 in response to the one or more voltage measurements (and the known ratio) indicating the temperature of the power switch, which may provide device protection. Disabling the power switch may include turning off power switch, and in some cases, disabling the power switch may also include preventing the power switch from being turned on. As noted, in some cases, the circuit response may occur based on a calculation of impedance (e.g., input impedance of the temperature-dependent circuit element within power switch circuit 704) indicating the temperature of the power switch within power switch circuit 704. Accordingly, in some examples, logic within unit 736 may be configured to control the power switch in response to a calculation of impedance indicating the temperature of the power switch, wherein the calculation of the impedance is based on the voltage measurements and the known ratio associated with high ohmic path 742. In still further examples, reaction on result unit 736 may include a communication channel to a control unit (e.g., a digital microprocessor, FPGA, ASIC, CPLD or microcontroller) in order to allow for system-level responses to temperature. In such cases, the control unit (not shown in FIG. 7) may adjust PWM signals (e.g., adjust duty cycles) based on temperature, which may be sent via signals from unit 736.

In some examples, voltage check measurement unit 734 of gate driver circuit 702 may be configured to perform several voltage measurements within a same switching period of the power switch within power switch circuit 704. Moreover, in some examples, voltage check measurement unit 734 of gate driver circuit 702 may be configured to perform the voltage measurements a plurality of times within each switching period of the power switch. In some examples, a filter structure may be used to filter results of several paired measurements to reduce noise effects or distortion of a single measurement. In still other cases, voltage check measurement unit 734 of gate driver circuit 402 may be configured to perform the one or more voltage measurements a plurality of times during successive switching periods (e.g., every period or every Nth period). Also, in some cases, voltage check measurement unit 734 of gate driver circuit 702 may be configured to perform the one or more voltage measurements in response to a command or trigger from a controller (not shown). Voltage check measurement unit 734 may be configured to refrain from voltage sensing at times when the power switch within power switch circuit 704 is unstable or in a transition state.

Figure 8:
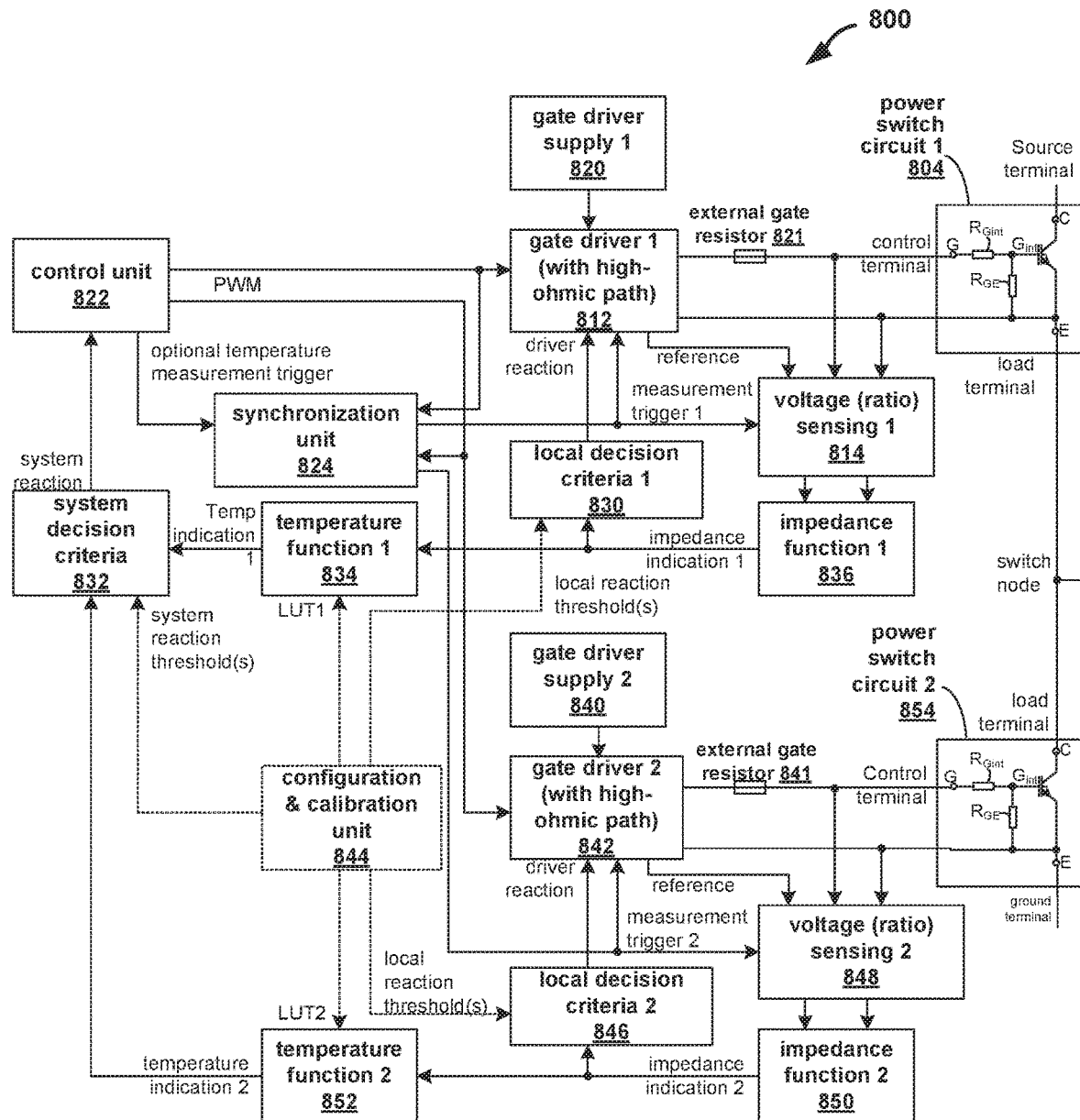
FIG. 8 is a block diagram of a circuit arrangement including both a low-side power switch and low-side driver circuit, and a high-side power switch and high-side driver circuit, whereby the driver circuits can modulate to define high output impedance.

FIG. 8 is another block diagram consistent with the techniques of this disclosure and including both a low-side power switch circuit and low-side gate driver circuit, and a high-side power switch and high-side driver circuit. The example of FIG. 8 includes a first power switch circuit 804 and a second power switch circuit 854, which may be referred to as high-side and low-side power switch circuits. A switch node located between first power switch circuit 804 second power switch circuit 854 delivers power to a load based on on/off switching of the power switches within circuits 804 and 854.

A first gate driver 812 (which includes the ability to modulate to a high ohmic path) delivers modulation control signals to the high-side power switch within power switch circuit 804, whereas a second gate driver 842 (which includes the ability to modulate to a high ohmic path) delivers modulation control signals to the low-side power switch within power switch circuit 854. Control unit 822 may deliver PWM commands to gate drivers 804 and 842 to coordinate the on/off switching of the high-side and low-side power switches. External gate resistors 821 and 841 may be included between the control terminals of the power switch circuits 804 and 854 and gate drivers 812 and 842, respectively. These external gate resistors 821 and 841, for example, may define resistances less than 10 Ohms. Gate driver supplies 820 and 840 may provide the power needed to operate gate drivers 812 and 842.

On the high-side, gate driver 812 may be configured to control a power switch within power switch circuit 804. In particular, gate driver 812 is configured to deliver a modulation signal to a control node of the power switch within power switch circuit 804 in order to control on/off switching of the power switch. Voltage (ratio) sensing unit 814 is configured to perform a voltage measurement associated with the temperature-dependent circuit element within power switch circuit 804. As described herein, the voltage measurement may be timed according to the switching period associated with on/off switching of the power switch within power switch circuit 804. According to this disclosure, the voltage measurement by voltage (ratio) sensing unit 814 may be used along with a known ratio associated with a high ohmic path of gate driver 812 to determine input impedance of a temperature dependent circuit element within power switch circuit 804. Moreover, the timing of the voltage measurement by voltage (ratio) sensing unit 814 (and corresponding modulation to the high ohmic path by gate driver 812) on the high-side, may be coordinated relative to the timing of voltage measurements (and corresponding modulation of the driver output impedance) low-side, via voltage (ratio) sensing unit 848.

On the low-side, gate driver 842 may be configured to control a power switch within power switch circuit 854. In particular, gate driver 842 is configured to deliver a modulation signal to a control node of the power switch within power switch circuit 854 in order to control on/off switching of the power switch. Voltage (ratio) sensing unit 848 is configured to perform a voltage measurement associated with the temperature-dependent circuit element within power switch circuit 854 at a time when the output impedance of gate driver 842 is modulated to a high ohmic path. As described herein, the measurements of voltage (and corresponding modulation of driver output impedance) may be timed according to the switching period associated with on/off switching of the power switch within power switch circuit 854. Moreover, the timing of the voltage measurements on the low-side, via voltage (ratio) sensing unit 848 may be coordinated relative to the timing of measurements of voltage on the high-side, via voltage (ratio) sensing unit 814.

In some cases, high-side and low-side voltage measurements (and corresponding modulation of driver output impedance) can be made periodically by voltage (ratio) sensing units 814 and 848, e.g., every other switching period or periodically. In some cases, voltage (ratio) sensing units 814 and 848 may perform sensing in a complimentary fashion, e.g., with voltage (ratio) sensing unit 814 operating in one switching period, and voltage (ratio) sensing unit 848 operating in another (different) switching period. As another example, voltage (ratio) sensing units 814 and 848 may perform sensing in a complimentary fashion, e.g., with voltage (ratio) sensing unit 814 operating in one portion of phase of a switching period, and voltage (ratio) sensing unit 848 operating in another (different) portion or phase of the switching period.

Synchronization unit 824 can deliver measurement trigger signals to voltage (ratio) sensing units 814 and 848 to coordinate timing of the voltage measurements on the high-side and on the low-side, e.g., at times with driver output impedance is also modulated to high ohmic paths. For both the high-side and the low-side, the voltage measurement or measurements (and corresponding modulation of driver output impedance) may be performed based on timing associated with the on/off switching of the power switches. Synchronization unit 824 may receive signals (or mirrors of signals) associated with PWM control signals from control unit 822, which are also delivered to gate drivers 812 and 842 in a complimentary fashion. In this way, synchronization unit 824 may identify the times when the power switches within power switch circuits 804 or 854 are stable and driver output impedance can be modulated, triggering measurements by voltage (ratio) sense unit 814 and by voltage (ratio) sense unit 848.

On the high-side, impedance function unit 836 may determine the impedance of a first temperature-dependent circuit element with power switch circuit 604 based on one or more voltage measurements associated with a high ohmic path of gate driver 812. Similarly, on the low-side, impedance function unit 850 may determine the impedance a second temperature-dependent circuit element with power switch circuit 854 based on one or more voltage measurements associated with a high ohmic path of gate driver 842.

The calculated impedance by impedance function units 836 and 848 may be used as an indicator of temperature. Accordingly, impedance function units 836 and 848 may provide signals indicative of impedance calculations to local decision units 830 and 846, respectively. Local decision units 830 may control logic within gate driver 812 on the high-side to provide immediate driver reactions to temperature. In some cases, logic within gate driver 812 may react to temperature-related changes in circuit operation on the high-side by causing gate driver 812 to disable power the power switch within power switch circuit 804 or to adjust transition time of the power switch within power switch circuit 804. Similarly, logic within gate driver 842 may react to temperature-related changes in circuit operation on the low-side by causing gate driver 842 to disable power the power switch within power switch circuit 854 or to adjust transition time of the power switch within power switch circuit 854.

In addition, impedance function units 836 and 848 may provide signals indicative of impedance calculations to temperature function units 834 and 852, respectively. Temperature function units 834 and 852 may apply a mathematical function or lookup tables (LUTs) in order to calculate temperatures based on the measured impedances. The contents of the LUTs, for example, may be filled with calculated values or may be filled with values elaborated during reference measurements with known temperatures. Temperature indications can be delivered from temperature function units 834 and 852 (associated with high-side and low-side switches respectively) to system decision criteria unit 832. System decision criteria unit 832 can then provide signals for system-level reactions to control unit 822 so that control unit can adjust or modify system operation based on the calculated temperatures associated with the high-side and low-side switches, respectively. For example, control unit 822 may adjust PWM signals for first gate driver 812, second gate driver 842, or both gate drivers 812, 842 based on the calculated temperatures. It may also be possible to eliminate temperature function units 834 and 852, in some examples, in which case control unit 822 may be configured to adjust the modulation signals based on the determined impedances determined by impedance function units 836 and 850. From a digital standpoint, however, it is often desirable to program control unit 822 in the temperature domain (rather than impedance domain) even though the calculated input impedance of the temperature-dependent circuit elements may be mathematically related to temperature. Again, if LUTs are used, the data within the LUTs, may be determined using calculated values or may be defined with values elaborated during reference measurements with known temperatures.

As with the circuit arrangement 600 of FIG. 6, various units within circuit arrangement 800 of FIG. 8 may be configurable, e.g., to configure one or more configurable parameters that define circuit operational responses to temperature. A configuration unit 844 (which may be an external programming unit), for example, may be capable of configuring local reaction thresholds defined by local decision criteria units 830 and 846. Alternatively or additionally, configuration unit 844 may be capable of configuring temperature functions within temperature function units 834 and 852, such as by defining or configuring lookup tables based on testing. Also, in some examples, configuration unit 844 may be capable of defining one or more system reaction thresholds for system decision criteria unit 832, such as for example, by defining temperature thresholds where PWM signals should be adjusted. The various configurable parameters, for example, could be derived from tests (e.g., during one or more production tests) and possibly stored in memory associated with the units or controller, such as one-time programmable (OTP) memory, Flash memory, electrically-erasable programmable read only memory (EEPROM) or any type of volatile or non-volatile memory.

According to this disclosure, in some cases, driver circuits may be configured to determine power switch temperature based on paired measurements of current and voltage at specific times within a switching period of a power switch. In other cases, according to this disclosure, driver circuits may be configured to determine power switch temperature by modulating from a low ohmic path to a high ohmic path so as to modulate the output impedance of the driver circuit and then performing one or more voltage measurements at specific times within a switching period of a power switch. In either of these scenarios, the specific times of sensing may occur a plurality of times within one switching period of the power switch. In other cases, the specific times for sensing may occur a plurality of times over successive switching periods of the power switch or switches, such as every Nth period of power switch 804, where N is a positive integer. Also, in still other cases, driver circuits may be configured to perform sensing in response to a command or trigger from a control unit. In some examples, a filter structure may be used to filter results of several paired measurements to reduce noise effects or distortion of a single measurement.

Figure 9:
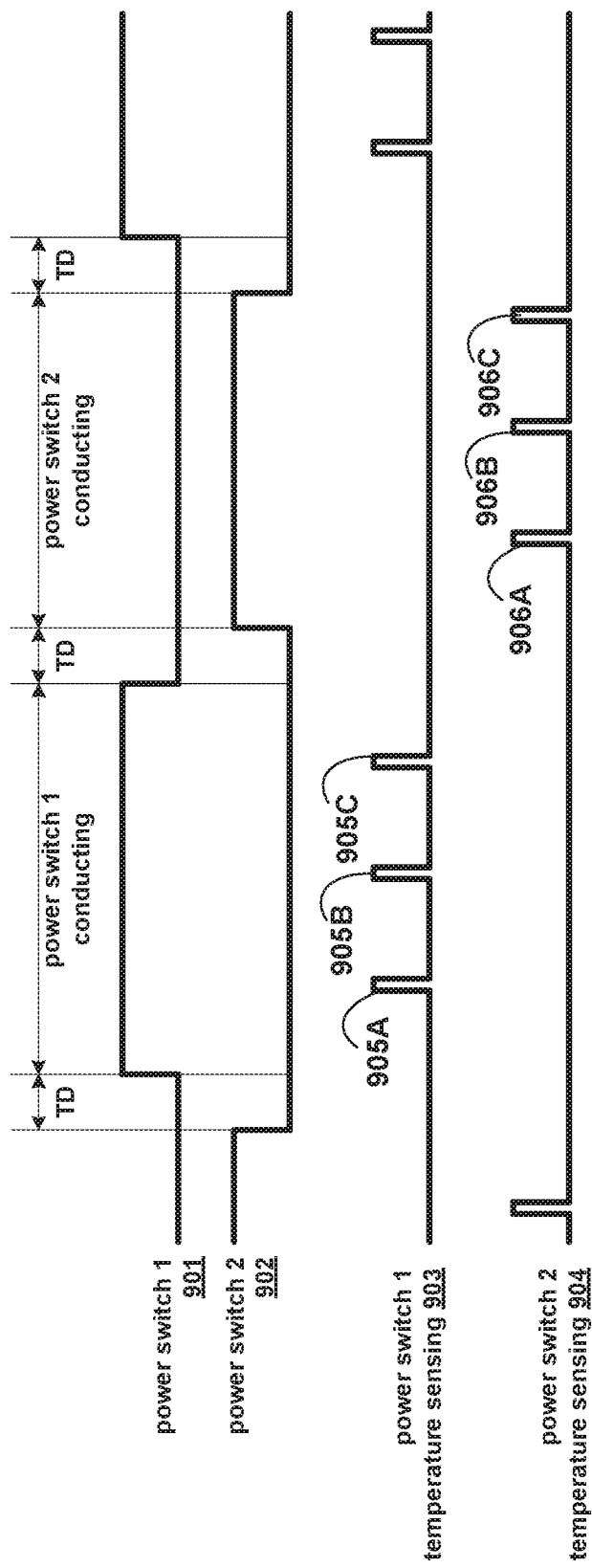
FIG. 9 is a timing diagram showing example timing of temperature sensing associated with high-side and low-side power switches.

FIG. 9 is a timing diagram showing one specific timing sequence of temperature sensing of high-side and low-side switches (such as power switch circuits 604 and 654 of FIG. 6 or power switch circuit 804 and 854 of FIG. 8). FIG. 9 is merely one example and many other timing sequences for temperature sensing could be used as described herein, based on the on/off switching of power switches. In the specific example of FIG. 9, graph 901 shows a switching period of a high-side power switch and graph 902 shows a complimentary switching period of a low-side power switch. For the high-side switch, temperature sensing graph 903 shows sensing events 905A, 905B and 905C. For the low-side switch, temperature sensing graph 904 shows sensing events 906A, 906B and 906C. In this example, the temperature sensing events 905A, 905B and 905C associated with the high-side switch are performed when the high-side switch is stable and conducting and when the low-side switch is stable and not conducting. Furthermore, in this example, the temperature sensing events 906A, 906B and 906C associated with the low-side switch are performed when the low-side switch is stable and conducting and when the high-side switch is stable and not conducting. In some examples, events 905A, 905B and 905C may correspond to a current sensing event and a plurality of voltage sensing events, and events 906A, 906B and 906C may correspond to a current sensing event and a plurality of voltage sensing events. In other examples, events 905A, 905B and 905C may correspond to voltage sensing events that correspond to modulation of driver output impedance on the high-side, and events 906A, 906B and 906C may correspond to voltage sensing events that correspond to modulation of driver output impedance on the low-side. Many other timing schemes could be used to provide sensing events every switching period, sensing events periodically every Nth switching period, sensing events in response to triggers or commands, sensing events that span over multiple switching periods, or timing schemes that are based on the on/off switching of the power switch or power switches. Again, in some examples, a filter structure may be used to filter results of several paired measurements to reduce noise effects or distortion of a single measurement.

Figure 10:
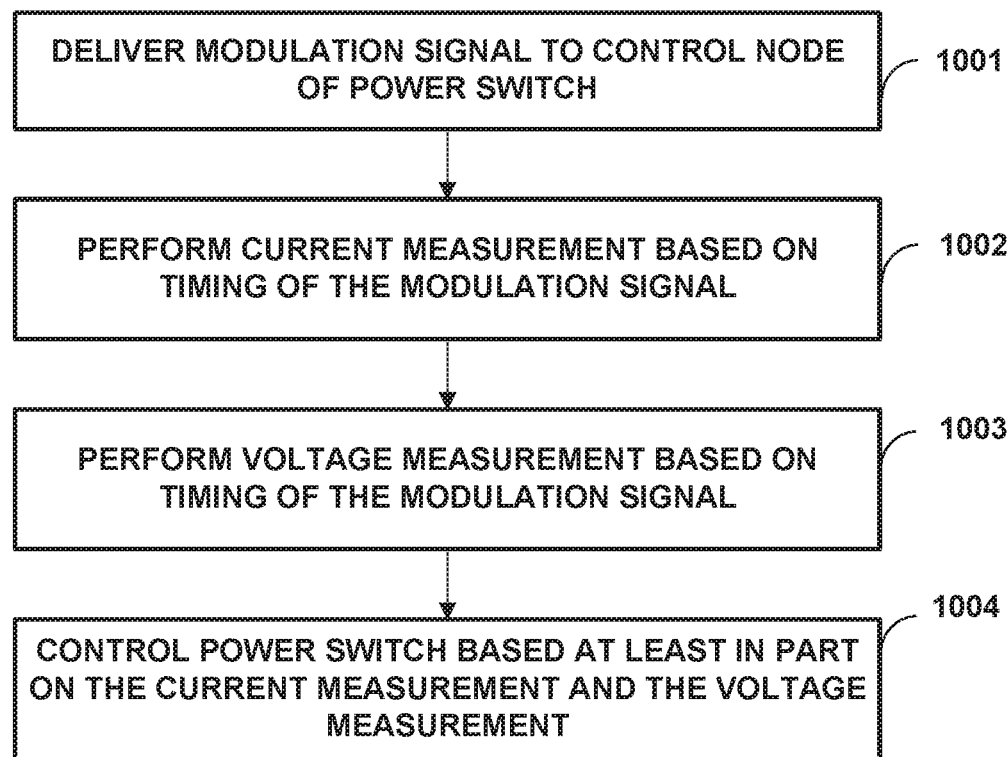
FIGS. 10 and 11 are flow diagrams of temperature sensing and control techniques that use paired voltage and current measurements consistent with this disclosure.
Figure 11:
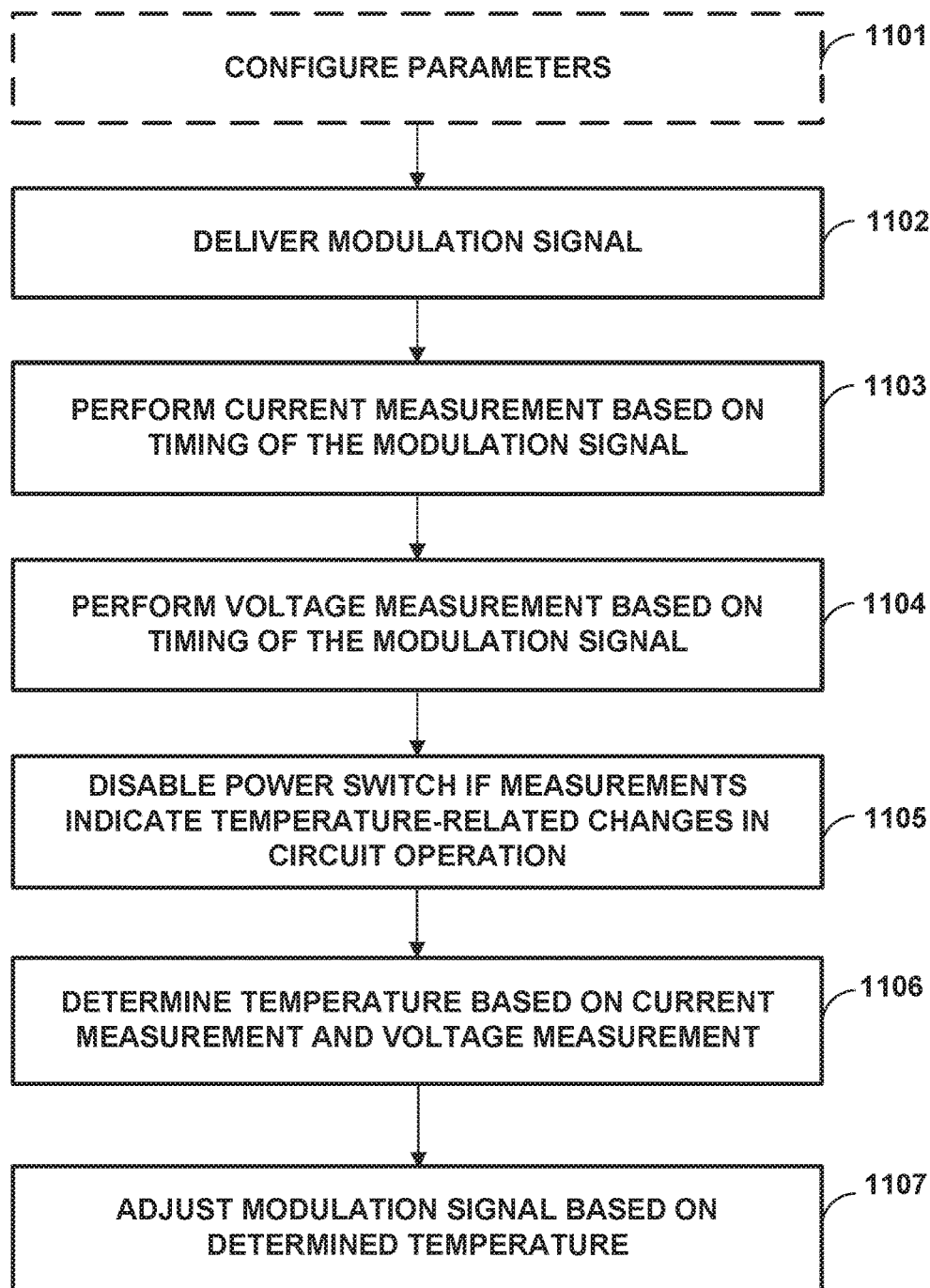

FIGS. 10 and 11 are two exemplary flow diagrams of temperature sensing and control techniques that use paired voltage and current measurements consistent with this disclosure. FIG. 10 will be described from the perspective of driver circuit 304 of circuit arrangement 300 in FIG. 3, although other circuits or circuit arrangements could also be used to perform the technique of FIG. 10. FIG. 10 is one example of a method of method of controlling a power switch circuit 304 including a power switch 308 and a temperature-dependent circuit element 306 electrically coupled to at least one node of the power switch. As shown in FIG. 10, driver 312 of driver circuit 302 delivers a modulation signal to a control node of power switch 308 to control on/off switching of the power switch 308 (1001). Current sense unit 314 performs a current measurement associated with the temperature-dependent circuit element 306 (1002), and voltage sense unit 314 performs a voltage measurement associated with the temperature-dependent circuit element 306 (1003). The current and voltage measurements may be paired and may be based on a timing sequence of the on/off switching of power switch 308, e.g., performed at times with power switch 308 is stable and not in a transition state. Driver circuit 312 may then control power switch 308 based at least in part on the current measurement and the voltage measurement (1004). In some examples, controlling the power switch may comprise controlling the power switch circuit in response to the current measurement and the voltage measurement indicating a temperature of the power switch. In some examples, the method of FIG. 10 may further include steps of calculating an impedance (e.g., an input impedance of temperature-dependent circuit element 306) based on the current measurement and the voltage measurement and controlling the power switch based on the calculated impedance. In some examples, the method of FIG. 10 may further include steps determining a temperature of the power switch based on the current measurement and the voltage measurement, wherein controlling the power switch comprises adjusting the modulation signal via a controller based on the determined temperature. Many other details described above could also be applied within the method shown in FIG. 10.

FIG. 11 is another flow diagram of temperature sensing and control techniques that use paired voltage and current measurements consistent with this disclosure. FIG. 11 will be described from the perspective of circuit arrangement 600 in FIG. 6, although other circuits or circuit arrangements could also be used to perform the technique of FIG. 11.

According to FIG. 11, an external configuration and calibration unit 644 may be used to configure parameters of one or more units within circuit arrangement 600 (1001), such as logic associated with local decision criteria 630, LUTs or mathematical equations applied by temperature function unit 634 and/or system decision criteria applied by unit 632. The ability to configure circuit arrangement 600, e.g., during manufacturing and testing phases, may be highly desirable so that circuit arrangement 600 can be tuned for different uses and applications (e.g., for controlling different types of loads or load arrangements in various different settings).

In operation, gate driver 612 delivers a modulation control signal to a control terminal of power switch circuit 604, e.g., through external gate resistor 621 (1102), which may control on/off switching of the power switch within power switch circuit 604. Voltage and current sensing unit 614 performs one or more voltage measurements based on timing of the modulation signal (1104) and performs one or more current measurements based on timing of the modulation signal (1105), which may define paired measurements for use in temperature determination and control. With the example of FIG. 11, logic within local decision criteria unit 630 may be configured to disable operation of the power switch within power switch circuit 604 if the measurements indicate a temperature related change in circuit operation (1105). A temperature-related change in circuit operation, for example, may be indicated by high temperature which may be defined or determined locally (e.g., by driver circuitry) via an impedance indication calculated by impedance function unit 636. The calculated impedance, for example, may comprise a measure of the input impedance of the temperature-dependent circuit element within power switch circuit 604, which may map to a temperature estimate of power switch circuit 604. This local response to temperature (via response to an impedance calculation) may be faster than a system response, so as to provide circuit and system protection against temperature changes in circuit operation. In addition to this immediate local response, the method of FIG. 11 may also facilitate a system response to temperature, which may be a more gradual and preventative action over time to help avoid overheating before it occurs. For example, temperature function unit 636 may determine a temperature indication based on the current and voltage measurement (1106), such as by applying a LUT to map a calculated impedance to the temperature indication. Since the calculated impedance is based on the paired current and voltage measurements, the temperature indication is also ultimately based on the paired measurements. In other examples, calculated impedance could also be used to cause system-level reactions, but it may be desirable to use temperature for system-level configuration, and hence it may be desirable to map the calculated impedance to the temperature indication via temperature function unit 634. Control unit 622 can then adjust the modulation signal based on the determined temperature (1107), e.g., by increasing or decreasing the duty cycle, which again, may allow for predictive or preventive protection against upward temperature trends. These steps as well as many other details described above could also be applied within the method shown in FIG. 11.

Figure 12:
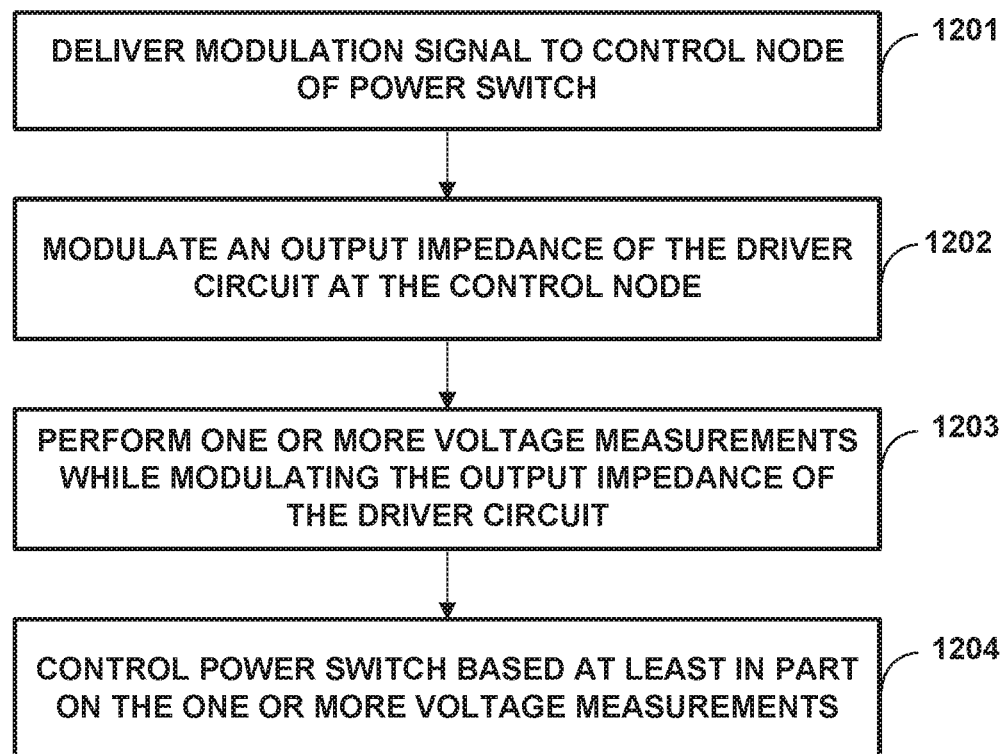
FIGS. 12 and 13 are flow diagrams of temperature sensing and control techniques that use modulation of driver output impedance and one or more voltage measurements consistent with this disclosure.
Figure 13:
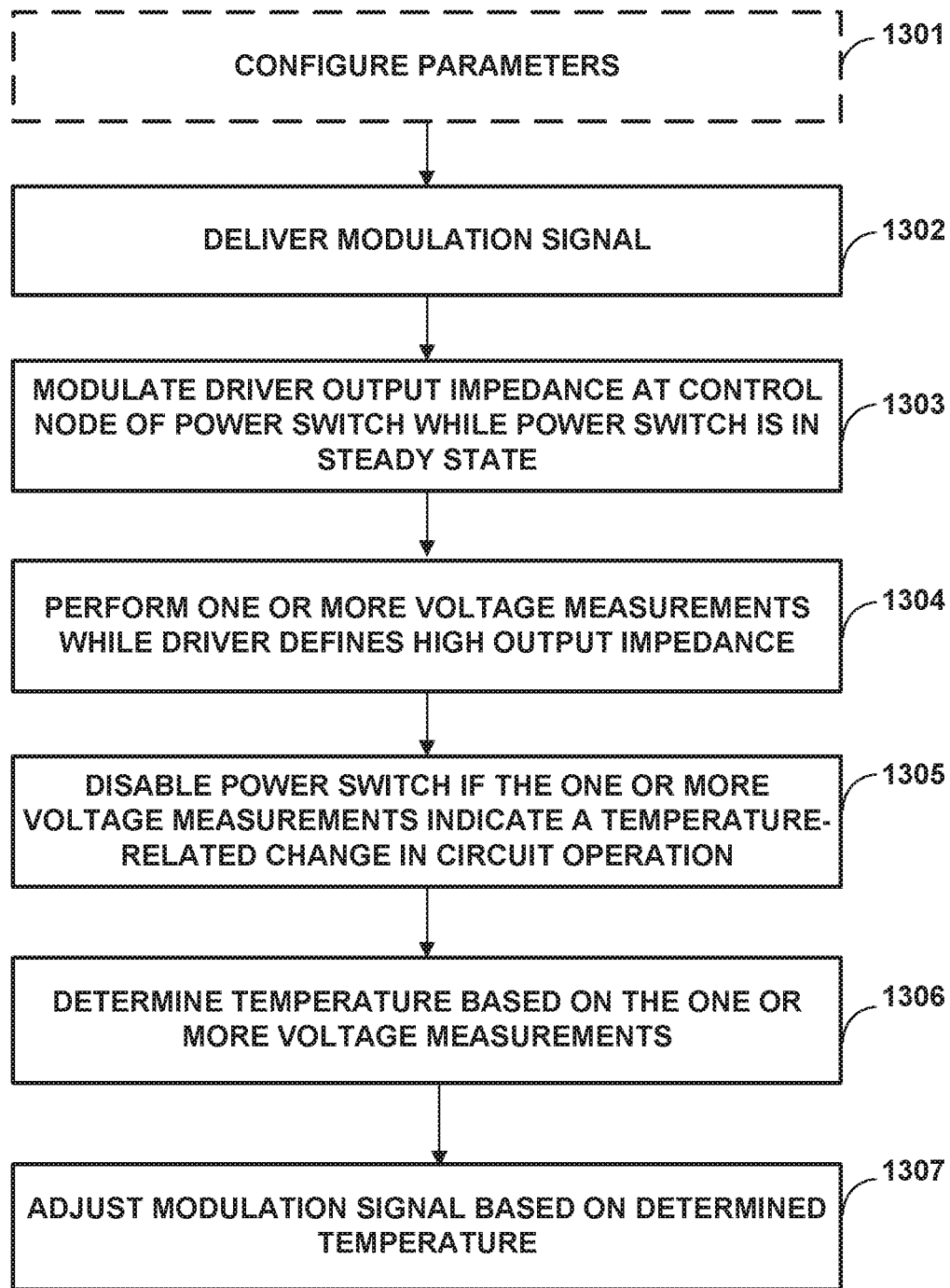

FIGS. 12 and 13 are flow diagrams of temperature sensing and control techniques that use modulation of driver output impedance and one or more voltage measurements consistent with this disclosure. FIG. 12 will be described from the perspective of driver circuit 404 of circuit arrangement 400 in FIG. 4, although other circuits or circuit arrangements could also be used to perform the technique of FIG. 12. FIG. 12 is one example of a method of method of controlling a power switch circuit 404 including a power switch 408 and a temperature-dependent circuit element 406 electrically coupled to at least one node of the power switch. As shown in FIG. 12, driver 412 of driver circuit 402 delivers a modulation signal to a control node of power switch 408 to control on/off switching of the power switch 408 (1001).

Driver 412 modulates its output impedance at the control node (1202), such as by switching from low ohmic path 417 to high ohmic path 418. Low ohmic path 417 and high ohmic path 418 may comprise alternative electrical paths through driver circuit 412 to the control node of the power switch 408 within power switch circuit 404. Alternatively, low ohmic path 417 and high ohmic path 418 could be defined by a common path with different operating conditions. In any case, while driver 412 defines the high ohmic path 418, voltage sense unit 416 performs one or more voltage measurements (1203). As described herein, switching the path of driver circuit 412 from low ohmic path 417 to high ohmic path 418 and performing the one or more voltage measurements may be performed according to a timing sequence that is based on timing associated with the on/off switching of power switch 408, e.g., at a time when power switch 408 is stable and when power switch 408 is not in a transition state Driver circuit 412 may control power switch 408 based at least in part on the one or more voltage measurements (1204). For example, the one or more voltage measurements in combination with a known ratio associated with high ohmic path 418 can be used by driver 412 to determine input impedance of temperature-dependent circuit element 406, and this input impedance or voltage ratio may be indicative of temperature of power switch circuit 404.

In some examples, controlling the power switch may comprise controlling the power switch circuit in response to the one or more voltage measurements (and the ratio) indicating a temperature of the power switch. In some examples, the method of FIG. 12 may further include steps of calculating an impedance (e.g., an input impedance of temperature-dependent circuit element 406) based on the voltage measurement (and the ratio) and controlling the power switch based on the calculated impedance or voltage ratio. In some examples, the method of FIG. 12 may further include steps determining a temperature of the power switch based on the one or more voltage measurements, wherein controlling the power switch comprises adjusting the modulation signal via a controller based on the determined temperature. Many other details described above could also be applied within the method shown in FIG. 12.

FIG. 13 is another flow diagram of temperature sensing and control techniques that use modulation of driver output impedance and one or more voltage measurements consistent with this disclosure. FIG. 13 will be described from the perspective of circuit arrangement 800 in FIG. 6, although other circuits or circuit arrangements could also be used to perform the technique of FIG. 13.

According to FIG. 13, an external configuration and calibration unit 844 may be used to configure parameters of one or more units within circuit arrangement 800 (1301), such logic associated with local decision criteria 830, LUTs or mathematical equations applied by temperature function unit 834 and/or system decision criteria applied by unit 832. The ability to configure circuit arrangement 800, e.g., during manufacturing and testing phases, may be highly desirable so that circuit arrangement 800 can be tuned for different uses and applications (e.g., for controlling different types of loads or load arrangements in various different settings).

In operation, gate driver 812 delivers a modulation control signal to a control terminal of power switch circuit 804, e.g., through external gate resistor 821 (1302), which may control on/off switching of the power switch within power switch circuit 804. Gate driver 812 modulates to a high ohmic path so as to modulate the output impedance of the gate driver 812 at the control node of the power switch associated with power switch circuit 804 (1303). Voltage (ratio) sensing unit 814 performs one or more voltage measurements based on timing of the modulation signal (1304) while gate driver 812 modulates its output impedance to the high ohmic path to define the high driver output impedance. The timing of modulating the output impedance of gate driver 812 (1303) and performing the one or more voltage measurements (1304) may be based on timing of the modulation control signal that defines on/off switching of the power switch within power switch circuit 804, e.g., at times with the power switch is stable and not in a transition state.

Similar to the example of FIG. 11, with the example of FIG. 13, logic within local decision criteria unit 830 may be configured to disable operation of the power switch within power switch circuit 804 if the measurements indicate a temperature related change in circuit operation (1305). A temperature-related change in circuit operation, for example, may be indicated by high temperature which may be defined or determined locally (e.g., by driver circuitry) via an impedance indication calculated by impedance function unit 836. The calculated impedance, for example, may comprise a measure of the input impedance of the temperature-dependent circuit element within power switch circuit 804, which may map to a temperature estimate of power switch circuit 804. This local response to temperature (via response to an impedance calculation) may be faster than a system response, so as to provide circuit and system protection against temperature related changes in circuit operation. In addition to this immediate local response, the method of FIG. 13 may also facilitate a system response to temperature, which may be a more gradual and preventative action over time to help avoid overheating before it occurs. For example, temperature function unit 836 may determine a temperature indication based on the current and voltage measurement (1306), such as by applying a LUT to map a calculated impedance or voltage ratio to the temperature indication. Since the calculated impedance or voltage ratio are based on the paired measurements, the temperature indication is also ultimately based on the paired measurements. In other examples, calculated impedance or voltage ratio could also be used to cause system-level reactions, but it may be desirable to use temperature for system-level configuration, and hence it may be desirable to map the calculated impedance or voltage ratio to the temperature indication via temperature function unit 834. Control unit 822 can then adjust the modulation signal based on the determined temperature (1107), e.g., by increasing or decreasing the duty cycle, which again, may allow for predictive or preventive protection against upward temperature trends. These steps as well as many other details described above could also be applied within the method shown in FIG. 13.

The following examples may illustrate one or more aspects of the disclosure.

Example 1—A circuit comprising a driver circuit configured to control a power switch circuit that includes a power switch and a temperature-dependent circuit element electrically coupled to at least one node of the power switch: wherein the driver circuit is configured to deliver a modulation signal to a control node of the power switch to control on/off switching of the power switch, wherein the driver circuit is configured to perform a current measurement and a voltage measurement associated with the temperature-dependent circuit element and control the power switch based at least in part on the current measurement and the voltage measurement, and wherein the current measurement and the voltage measurement are performed based on timing associated with the on/off switching of the power switch.

Example 2—The circuit of example 1, wherein the current measurement and the voltage measurement are performed at a time when a voltage over the power switch is stable and the power switch is not in a transition state.

Example 3—The circuit of example 1 or 2, wherein the current measurement and the voltage measurement are performed at a time when the power switch is turned on.

Example 4—The circuit of example 1 or 2, wherein the current measurement and the voltage measurement are performed at a time when the power switch is turned off, and wherein the driver circuit is configured to apply a negative voltage to the control node during the current measurement and the voltage measurement.

Example 5—The circuit of any of examples 1-4, wherein the current measurement and the voltage measurement are paired measurements.

Example 6—The circuit of claim 5, wherein the circuit is configured to store the paired measurements.

Example 7—The circuit of any of examples 1-6, wherein the voltage measurement comprises a measurement of voltage supplied to the driver circuit for driving the power switch.

Example 8—The circuit of any of examples 1-6, wherein the voltage measurement comprises a measurement of voltage drop across the temperature dependent circuit element.

Example 9—The circuit of any of examples 1-8, wherein the driver circuit includes logic configured to control the power switch in response to the current measurement and the voltage measurement indicating a temperature of the power switch.

Example 10—The circuit of example 9, wherein the logic is configured to adjust transition speed of the power switch in response to the current measurement and the voltage measurement indicating the temperature of the power switch.

Example 11—The circuit of example 9 or 10, wherein the logic is configured to disable the power switch in response to the current measurement and the voltage measurement indicating the temperature of the power switch.

Example 12—The circuit of any of examples 9-11, wherein the logic is configured to control the power switch in response to a calculation of impedance indicating the temperature of the power switch, wherein the calculation of the impedance is based on the current measurement and the voltage measurement.

Example 13—The circuit of example 12, the circuit further comprising a control unit configured to adjust the modulation signal based on the determined impedance.

Example 14—The circuit of any of examples 1-13, wherein the driver circuit includes a temperature unit configured to determine a temperature of the power switch based on the current measurement and the voltage measurement.

Example 15—The circuit of example 14, wherein the temperature unit comprises a lookup table, wherein inputs to the lookup table are the current measurement and the voltage measurement.

Example 16—The circuit of any of examples 1-14, wherein the circuit further comprises a control unit configured to adjust the modulation signal based on a determined temperature.

Example 17—The circuit of any of examples 1-16, wherein the driver circuit includes logic configured to control the power switch in response to the current measurement and the voltage measurement indicating the temperature of the power switch.

Example 18—The circuit of example 17, wherein the logic is configurable via an external configuration unit that adjusts one or more configurable parameters.

Example 19—The circuit of any of examples 14-18, wherein the temperature unit is configurable via the external configuration unit that adjusts the one or more configurable parameters.

Example 20—The circuit of any of examples 13-19, wherein the control unit is configurable via the external configuration unit that adjusts the one or more configurable parameters.

Example 21—The circuit of any of examples 1-20, wherein the driver circuit is configured to perform the current measurement and the voltage measurement within a same switching period of the power switch.

Example 22—The circuit of any of examples 1-21, wherein the driver circuit is configured to perform at least one of the current measurement or the voltage measurement a plurality of times within each switching period of the power switch.

Example 23—The circuit of any of examples 1-22, wherein the driver circuit is configured to perform at least one current measurement and a plurality of voltage measurements within a same switching period of the power switch.

Example 24—The circuit of any of examples 1-23, wherein the power switch circuit comprises a high-side power switch circuit, the power switch comprises a high-side power switch, the temperate-dependent circuit element comprises a first temperate dependent circuit element, the modulation signal comprises a high-side modulation signal, and the driver circuit comprises a high-side driver circuit, the circuit further comprising: a low-side driver circuit configured to deliver a low-side modulation signal to a control node of a low-side power switch to control on/off switching of the low-side power switch, wherein the low-side driver circuit is further configured to perform a current measurement and a voltage measurement associated with a second temperature-dependent circuit element and control the low-side power switch based at least in part on the current measurement and the voltage measurement associated with the second temperature-dependent circuit element.

Example 25—The circuit of example 24, wherein the current measurement and the voltage measurement performed by the high-side driver circuit are performed when both the high-side switch and the low-side switch are stable, one of the high-side switch and the low-side switch are on, and one of the high-side switch and the low-side switch are off.

Example 26—The circuit of example 24 or 25, wherein the current measurement and the voltage measurement performed by the low-side driver circuit are performed when both the high-side switch and the low-side switch are stable, one of the high-side switch and the low-side switch are on, and one of the high-side switch and the low-side switch are off.

Example 27—A method of controlling a power switch circuit including a power switch and a temperature-dependent circuit element electrically coupled to at least one node of the power switch, the method comprising: delivering a modulation signal to a control node of the power switch to control on/off switching of the power switch; performing a current measurement associated with the temperature-dependent circuit element; performing a voltage measurement associated with the temperature-dependent circuit element; and controlling the power switch based at least in part on the current measurement and the voltage measurement.

Example 28—The method of example 27, further comprising: performing the current measurement and the voltage measurement according to a timing sequence that is based on timing associated with the on/off switching of the power switch.

Example 29—The method of example 27 or 28, wherein controlling the power switch comprises: controlling the power switch circuit in response to the current measurement and the voltage measurement indicating a temperature of the power switch.

Example 30—The method of any of examples 27-29, further comprising: calculating an impedance based on the current measurement and the voltage measurement and controlling the power switch based on the calculated impedance.

Example 31—The method of any of example 27-30, further comprising: determining a temperature of the power switch based on the current measurement and the voltage measurement, wherein controlling the power switch comprises adjusting the modulation signal via a controller based on the determined temperature.

Example 32—The method of any of examples 27-31, wherein performing the current measurement and the voltage measurement comprises: performing the current measurement and the voltage measurement in a paired manner.

Example 33—The method of example 32, wherein performing the current measurement and the voltage measurement in the paired manner comprises performing the current measurement and the voltage measurement within a same switching period of the power switch.

Example 34—The method of any of examples 27-33, further comprising: configuring one or more parameters associated with controlling the power switch circuit, wherein the one or more parameters define one or more temperature-dependent functions associated with controlling the power switch.

Example 35—A circuit arrangement comprising: a power switch circuit including a power switch and a temperature-dependent circuit element electrically coupled to at least one node of the power switch; and a driver circuit configured to deliver a modulation signal to a control node of the power switch to control on/off switching of the power switch, wherein the driver circuit is configured to perform a current measurement and a voltage measurement associated with the temperature-dependent circuit element and control the power switch based at least in part on the current measurement and the voltage measurement, and wherein the current measurement and the voltage measurement are performed based on timing associated with the on/off switching of the power switch.

Example 36—The circuit arrangement of example 35, wherein the temperature-dependent circuit element comprises a temperature-dependent resistor.

Example 37—The circuit arrangement of example 35 or 36, wherein the temperature-dependent circuit element is electrically coupled to the control node of the power switch and a load node of the power switch.

Example 38—The circuit arrangement of any of examples 35-37, wherein the temperature-dependent circuit element is electrically coupled to a dedicated sensing node associated with the power switch circuit and a load node of the power switch.

Example 39—The circuit arrangement of any of examples 35-38, wherein the driver circuit includes an analog to digital converter configured to perform the current measurement.

Example 40—The circuit arrangement of any of examples 35-39, wherein the driver circuit includes a shunt resistor configured to perform the current measurement.

Example 41—A circuit configured to control a power switch circuit that includes a power switch and a temperature-dependent circuit element electrically coupled to at least one node of the power switch, the circuit comprising: a driver circuit configured to be coupled to a supply circuit, wherein the driver circuit is configured to deliver a modulation signal to a control node of the power switch to control on/off switching of the power switch, wherein the driver circuit is further configured to modulate an output impedance of the driver circuit at the control node, perform one or more voltage measurements while modulating the output impedance of the driver circuit, and control the power switch based at least in part on the one or more voltage measurements.

Example 42—The circuit of example 41, wherein the driver circuit is configured to calculate an input impedance of the temperature-dependent circuit element based on the one or more voltage measurements when modulating the output impedance of the driver circuit.

Example 43—The circuit of example 41 or 42, wherein the driver circuit includes: a low ohmic path from the supply circuit to the control node; and a high ohmic path from the supply circuit to the control node; wherein one or more control signals are configured to switch the driver circuit between the low ohmic path and the high ohmic path, wherein to modulate the output impedance, the driver circuit is configured to switch from the low ohmic path to the high ohmic path, and wherein the driver circuit is configured to perform the one or more voltage measurements while the driver circuit is configured to define the high ohmic path, wherein the one or more voltage measurements are associated with an input impedance of the temperature-dependent circuit element.

Example 44—The circuit of example 43, wherein driver circuit is configured to switch from the low ohmic path to the high ohmic path and perform the one or more voltage measurements based on timing associated with the on/off switching of the power switch.

Example 45—The circuit of example 43 or 44, wherein the driver circuit is configured to switch from the low ohmic path to the high ohmic path and perform the one or more voltage measurements at a time when the power switch is stable and the power switch is not in a transition state.

Example 46—The circuit of any of examples 41-45, wherein the one or more voltage measurements are performed at a time when the power switch is turned on.

Example 47—The circuit of any of examples 41-45, wherein the one or more voltage measurements are performed at a time when the power switch is turned off, and wherein the driver circuit is configured to apply a negative voltage to the control node during the one or more voltage measurements.

Example 48—The circuit of any of examples 43-47, wherein driver circuit is configured to switch from the low ohmic path to the high ohmic path and perform the one or more voltage measurements a plurality of times within one switching period of the power switch.

Example 49—The circuit of any of examples 41-48, wherein the driver circuit includes a temperature unit configured to determine a temperature of the power switch based on the one or more voltage measurements.

Example 50—The circuit of example 49, wherein the temperature unit comprises a lookup table, wherein inputs to the lookup table are based on the one or more voltage measurements.

Example 51—The circuit of any of examples 41-50, wherein the circuit further comprises a control unit configured to adjust the modulation signal based on a determined temperature.

Example 52—The circuit of any of examples 41-51, wherein the driver circuit includes logic configured to control the power switch in response to the voltage measurement indicating a temperature of the power switch.

Example 53—The circuit of example 52, wherein the logic is configured to adjust a transition speed of the power switch in response to the one or more voltage measurements.

Example 54—The circuit of example 52 or 53, wherein the logic is configured to disable the power switch in response to the one or more voltage measurements.

Example 55—The circuit of any of examples 52-54, wherein the logic is configured to control the power switch in response to a calculation of input impedance of the temperature-dependent circuit element, wherein the calculation of input impedance is based on the one or more voltage measurements when modulating the output impedance of the driver circuit.

Example 56—The circuit of any of examples 52-55, wherein the logic is configurable via an external configuration unit that adjusts one or more configurable parameters.

Example 57—The circuit of example 49, wherein the temperature unit is configurable via the external configuration unit that adjusts the one or more configurable parameters.

Example 58—The circuit of example 51, wherein the control unit is configurable via the external configuration unit that adjusts the one or more configurable parameters.

Example 59—The circuit of any of examples 41-58, wherein the power switch circuit comprises a high-side power switch circuit, the power switch comprises a high-side power switch, the supply circuit comprises a high-side supply circuit, the temperate-dependent circuit element comprises a first temperate dependent circuit element, and the driver circuit comprises a high-side driver circuit, and the circuit further comprising: a low-side driver circuit configured to be coupled to a low-side supply circuit, wherein the low-side driver circuit is configured to deliver a modulation to a control node of a low-side power switch to control on/off switching of the low-side power switch, wherein the low-side driver circuit is further configured to modulate an output impedance of the low-side driver circuit at the control node, perform one or more voltage measurements while modulating the output impedance of the low-side driver circuit, and control the low-side power switch based at least in part on the one or more voltage measurements.

Example 60—A method of controlling a power switch circuit including a power switch and a temperature-dependent circuit element electrically coupled to at least one node of the power switch, the method comprising: delivering a modulation signal to a control node of the power switch to control on/off switching of the power switch; modulating an output impedance of the driver circuit at the control node; performing one or more voltage measurements while modulating the output impedance of the driver circuit; and controlling the power switch based at least in part on the one or more voltage measurements.

Example 61—The method of example 60, further comprising: calculating an input impedance of the temperature-dependent circuit element based on the one or more voltage measurements when modulating the output impedance of the driver circuit.

Example 62—The method of example 60 or 61, wherein modulating the output impedance comprises switching a path of the driver circuit that delivers the modulation signal from a low ohmic path to a high ohmic path, wherein the low ohmic path and the high ohmic paths are alternative electrical paths through the driver circuit to the control node.

Example 63—The method of any of examples 60-62, further comprising: switching the path of the driver circuit and performing the one or more voltage measurements according to a timing sequence that is based on timing associated with the on/off switching of the power switch.

Example 64—The method of any of examples 60-63, further comprising switching the path of the driver circuit and performing the one or more voltage measurements at a time when the power switch is stable and the power switch is not in a transition state.

Example 65—The method of any of examples 60-64, further comprising: switching the path of the driver circuit and performing the one or more voltage measurements a plurality of times within a switching period of the power switch.

Example 66—The method of any of examples 60-65, wherein modulating the output impedance comprises switching a path of the driver circuit that delivers the modulation signal from a low ohmic path to a high ohmic path, wherein the low ohmic path and the high ohmic paths are defined by a common path with different operating conditions.

Example 67—The method of any of examples 60-66, further comprising: controlling the power switch based at least in part on the one or more voltage measurements.

Example 68—The method of any of examples 60-67, wherein controlling the power switch based in part on the one or more voltage measurements comprises disabling the power switch via logic of a driver circuit in response to the one or more voltage measurements.

Example 69—The method of any of examples 60-68, wherein controlling the power switch based in part on the one or more voltage measurements comprises adjusting a transition speed of the power switch in response to the voltage measurement indicating a temperature of the power switch.

Example 70—The method of any of examples 60-69, further comprising: determining a temperature of the power switch based on the one or more voltage measurements.

Example 71—The method of any of examples 60-70, wherein controlling the power switch based in part on the one or more voltage measurements comprises adjusting the modulation signal via a controller based on a determined temperature.

Example 72—The method of any of examples 60-71, further comprising: configuring one or more parameters associated with controlling the power switch circuit, wherein the one or more parameters define one or more temperature-dependent functions associated with controlling the power switch.

Example 73—A circuit arrangement comprising: a power switch circuit including a power switch and a temperature-dependent circuit element electrically coupled to at least one node of the power switch; and a driver circuit configured to be coupled to a supply circuit, wherein the driver circuit is configured to deliver a modulation signal to a control node of the power switch to control on/off switching of the power switch, wherein the driver circuit is further configured to modulate an output impedance of the driver circuit at the control node, perform one or more voltage measurements while modulating the output impedance of the driver circuit, and control the power switch based at least in part on the one or more voltage measurements.

Example 74—The circuit arrangement of example 73, wherein the driver circuit is configured to calculate an input impedance of the temperature-dependent circuit element based on the one or more voltage measurements when modulating the output impedance of the driver circuit.

Example 75—The circuit arrangement of example 73 or 74, wherein the driver circuit includes: a low ohmic path from the supply circuit to the control node; and a high ohmic path from the supply circuit to the control node; wherein one or more control signals are configured to switch the driver circuit between the low ohmic path and the high ohmic path, wherein to modulate the output impedance, the driver circuit is configured to switch from the low ohmic path to the high ohmic path, and wherein the driver circuit is configured to perform the one or more voltage measurements while the driver circuit is configured to define the high ohmic path, wherein the one or more voltage measurements are associated with an input impedance of the temperature-dependent circuit element.

Example 76—The circuit arrangement of example 75, wherein driver circuit is configured to switch from the low ohmic path to the high ohmic path and perform the one or more voltage measurements based on timing associated with the on/off switching of the power switch.

Example 77—The circuit arrangement example 75 or 76, wherein the driver circuit is configured to switch from the low ohmic path to the high ohmic path and perform the one or more voltage measurements at a time when the power switch is stable and the power switch is not in a transition state.

Example 78—The circuit arrangement of any of examples 73-77, wherein the temperature-dependent circuit element comprises a temperature-dependent resistor.

Example 79—The circuit arrangement of any of examples 73-78, wherein the temperature-dependent circuit element is electrically coupled to the control node of the power switch and a load node of the power switch.

Example 80—The circuit arrangement of any of examples 73-78, wherein the temperature-dependent circuit element is electrically coupled to a dedicated sensing node associated with the power switch circuit and a load node of the power switch.

Example 81—The circuit arrangement of any of examples 73-80, wherein the driver circuit includes an analog-to-digital converter to perform the one or more voltage measurements.

Various aspects have been described in this disclosure. These and other aspects are within the scope of the following claims.

The invention claimed is:

1. A circuit comprising a driver circuit configured to control a power switch circuit that includes a power switch and a temperature-dependent circuit element electrically coupled to at least one node of the power switch:
wherein the driver circuit is configured to deliver a modulation signal to a control node of the power switch to control on/off switching of the power switch,
wherein the driver circuit is configured to perform a current measurement and a voltage measurement associated with the temperature-dependent circuit element and control the power switch based at least in part on the current measurement and the voltage measurement, and
wherein the current measurement and the voltage measurement are performed based on timing associated with the on/off switching of the power switch.

2. The circuit of claim 1, wherein the current measurement and the voltage measurement are performed at a time when a voltage over the power switch is stable and the power switch is not in a transition state.

3. The circuit of claim 2, wherein the current measurement and the voltage measurement are performed at a time when the power switch is turned on.

4. The circuit of claim 2, wherein the current measurement and the voltage measurement are performed at a time when the power switch is turned off, and wherein the driver circuit is configured to apply a negative voltage to the control node during the current measurement and the voltage measurement.

5. The circuit of claim 1, wherein the current measurement and the voltage measurement are paired measurements.

6. The circuit of claim 1, wherein the driver circuit includes logic configured to control the power switch in response to the current measurement and the voltage measurement indicating a temperature of the power switch.

7. The circuit of claim 6, wherein the logic is configured to adjust transition speed of the power switch in response to the current measurement and the voltage measurement indicating the temperature of the power switch.

8. The circuit of claim 6, wherein the logic is configured to disable the power switch in response to the current measurement and the voltage measurement indicating the temperature of the power switch.

9. The circuit of claim 6, wherein the logic is configured to control the power switch in response to a calculation of impedance indicating the temperature of the power switch, wherein the calculation of the impedance is based on the current measurement and the voltage measurement.

10. The circuit of claim 1, wherein the driver circuit includes a temperature unit configured to determine a temperature of the power switch based on the current measurement and the voltage measurement.

11. The circuit of claim 10, wherein the circuit further comprises a control unit configured to adjust the modulation signal based on the determined temperature.

12. The circuit of claim 1, wherein the driver circuit is configured to perform the current measurement and the voltage measurement within a same switching period of the power switch.

13. The circuit of claim 1, wherein the driver circuit is configured to perform at least one of the current measurement or the voltage measurement a plurality of times within each switching period of the power switch.

14. The circuit of claim 1, wherein the driver circuit is configured to perform at least one current measurement and a plurality of voltage measurements within a same switching period of the power switch.

15. A method of controlling a power switch circuit including a power switch and a temperature-dependent circuit element electrically coupled to at least one node of the power switch, the method comprising:
delivering a modulation signal to a control node of the power switch to control on/off switching of the power switch;
performing a current measurement associated with the temperature-dependent circuit element;

performing a voltage measurement associated with the temperature-dependent circuit element, wherein performing the current measurement and performing the voltage measurement comprises performing the current measurement and the voltage measurement according to a timing sequence that is based on timing associated with the on/off switching of the power switch; and controlling the power switch based at least in part on the current measurement and the voltage measurement.

16. The method of claim 15, wherein controlling the power switch comprises:

controlling the power switch circuit in response to the current measurement and the voltage measurement indicating a temperature of the power switch.

17. The method of claim 15, further comprising:

calculating an impedance based on the current measurement and the voltage measurement and controlling the power switch based on the calculated impedance.

18. The method of claim 15, further comprising:

determining a temperature of the power switch based on the current measurement and the voltage measurement, wherein controlling the power switch comprises adjusting the modulation signal via a controller based on the determined temperature.

19. The method of claim 15, wherein performing the current measurement and the voltage measurement comprises:

performing the current measurement and the voltage measurement in a paired manner.

20. The method of claim 19, wherein performing the current measurement and the voltage measurement in the paired manner comprises performing the current measurement and the voltage measurement within a same switching period of the power switch.

21. A circuit arrangement comprising:

a power switch circuit including a power switch and a temperature-dependent circuit element electrically coupled to at least one node of the power switch; and a driver circuit configured to deliver a modulation signal to a control node of the power switch to control on/off switching of the power switch, wherein the driver circuit is configured to perform a current measurement and a voltage measurement associated with the temperature-dependent circuit element and control the power switch based at least in part on the current measurement and the voltage measurement, and wherein the current measurement and the voltage measurement are performed based on timing associated with the on/off switching of the power switch.

* * * * *